(12) United States Patent
Park et al.

(10) Patent No.: US 10,325,987 B2
(45) Date of Patent: Jun. 18, 2019

(54) MONOLAYER FILMS OF SEMICONDUCTING METAL DICHALCOGENIDES, METHODS OF MAKING SAME, AND USES OF SAME

(71) Applicant: Cornell University, Ithaca, NY (US)

(72) Inventors: Jiwoong Park, Ithaca, NY (US); Kibum Kang, Ithaca, NY (US); Saien Xie, Ithaca, NY (US)

(73) Assignee: Cornell University, Ithaca, NY (US)

( * ) Notice: Subject to any disclaimer, the term of this patent is extended or adjusted under 35 U.S.C. 154(b) by 256 days.

(21) Appl. No.: 15/130,407

(22) Filed: Apr. 15, 2016

(65) Prior Publication Data

US 2016/0308006 A1 Oct. 20, 2016

Related U.S. Application Data

(60) Provisional application No. 62/148,387, filed on Apr. 16, 2015.

(51) Int. Cl.
| | | |
|---|---|---|
| *H01L 29/24* | (2006.01) | |
| *H01L 21/02* | (2006.01) | |
| *H01L 29/66* | (2006.01) | |
| *H01L 29/786* | (2006.01) | |

(52) U.S. Cl.
CPC .......... *H01L 29/24* (2013.01); *H01L 21/0242* (2013.01); *H01L 21/0262* (2013.01); *H01L 21/02381* (2013.01); *H01L 21/02422* (2013.01); *H01L 21/02488* (2013.01); *H01L 21/02568* (2013.01); *H01L 29/66969* (2013.01); *H01L 29/786* (2013.01)

(58) Field of Classification Search
CPC ............... H01L 29/24; H01L 21/02381; H01L 21/0242; H01L 21/02422; H01L 21/02488; H01L 21/02568; H01L 21/0262; H01L 29/66969; H01L 129/786; H01L 29/786
USPC ......................................... 428/446
See application file for complete search history.

(56) References Cited

U.S. PATENT DOCUMENTS

| | | |
|---|---|---|
| 2014/0027775 A1 | 1/2014 | Quick |
| 2014/0251204 A1 | 9/2014 | Najmaei et al. |
| 2015/0083206 A1 | 3/2015 | Novoselov et al. |
| 2015/0118487 A1 | 4/2015 | Wolden et al. |

FOREIGN PATENT DOCUMENTS

WO 2015114357 8/2015

OTHER PUBLICATIONS

Putkonen, M., "Precursors for ALD Processes," Atomic Layer Deposition of Nanostructure Materials, 1st Ed., Wiley-VCH Verlag GmbH. (Year: 2012).*

(Continued)

*Primary Examiner* — Josephine L Chang
(74) *Attorney, Agent, or Firm* — Hodgson Russ LLP

(57) ABSTRACT

Metal-chalcogenide films disposed on a substrate comprising at least one monolayer (e.g., 1 to 10 monolayers) of a metal-chalcogenide. The films can be continuous (e.g., structurally and/or electrically continuous) over 80% or greater of the substrate that is covered by the film. The films can be made by methods based on low metal precursor concentration relative to the concentration of chalcogenide precursor. The methods can be carried out at low water concentration. The films can be used in devices (e.g., electrical devices and electronic devices).

16 Claims, 14 Drawing Sheets

(56) References Cited

OTHER PUBLICATIONS

Kang, et al., "High-mobility three-atom-thick semiconducting films with wafer-scale homogeneity", Nature,. Apr. 30, 2015, 520(7549):656-660, Apr. 30, 2015.
Song, et al., "Synthesis and properties of molybdenum disulphide: from bulk to atomic layers", DOI: 10.1039/C4RA11852A (Review Article) RSC Adv., 2015, 5, 7495-7514, Dec. 31, 2015.
Reale, et al., "From bulk crystals to atomically thin layers of group VI-transition metal dichalcogenides vapour phase synthesis", Applied Materials Today; vol. 3, Jun. 2016, pp. 11-22, Jun. 1, 2016.
Coleman et al., "Effects of Ozone Plasma Treatment and X-Ray Irradiation on Optical Properties of Atomically Thin Molybdenum Disulfide", Young Scientist Journal, vol. 4, May 2014, May 1, 2014.
Zhang, et al. "Phonon and Raman scattering of two-dimensional transition metal dichalcogenides from monolayer, multilayer to bulk material", The Royal Society of Chemistry, 2015, Aug. 22, 2014.
Okada, et al., "Direct Chemical Vapor Deposition Growth of WS2 Atomic Layers on Hexagonal Boron Nitride", ACS Nano, 2014, 8 (8), pp. 8273-8277, Jan. 1, 2014.
Das et al., Synthesis, Properties, and Applications of 2-D Materials: A Comprehensive Review, Critical Reviews in Solid State and Materials Sciences, vol. 39, No. 4, pp. 231-252. Jul. 4, 2014.
Kumar et al., A predictive approach to CVD of crystalline layers of TMDs: the case of MoS2, Nanoscale, vol. 7, No. 17, pp. 7802-7810. Mar. 25, 2015.
Mao, D., et al., WS2 mode-locked ultrafast fiber laser, Scientific Reports, Jan. 22, 2015, vol. 5, pp. 7965 (7 pages).
Zhou, H., et al., Large Area Growth and Electrical Properties of p-Type WSe 2 Atomic Layers, Nano Letters, Jan. 14, 2015, vol. 15, No. 1, pp. 709-713.
Parthasarathy, V.T. and Berry, V., MoS2 Devices Using Pencil Circuits, In Meeting Abstracts, The Electrochemical Society, 2015, No. 9, pp. 862-862.

\* cited by examiner a: Water effect b: DES concentration dependence     c: High Mo vapour pressure

MONOLAYER FILMS OF SEMICONDUCTING METAL DICHALCOGENIDES, METHODS OF MAKING SAME, AND USES OF SAME

CROSS-REFERENCE TO RELATED APPLICATIONS

This application claims priority to U.S. provisional patent application No. 62/148,387, filed Apr. 16, 2015, the disclosure of which is incorporated herein by reference.

STATEMENT REGARDING FEDERALLY SPONSORED RESEARCH

This invention was made with government support under contract nos. FA2386-13-1-4118 and FA9550-11-1-0033 awarded by the Air Force Office of Scientific Research and contract nos. DMR-1120296 and ECS-0335765 awarded by National Science Foundation. The government has certain rights in the invention.

FIELD OF THE DISCLOSURE

The present disclosure generally relates to metal-chalcogenide films. More particularly, the present disclosure relates to semiconducting metal-chalcogenide films.

SUMMARY OF THE DISCLOSURE

In an aspect, the present disclosure provides metal-chalcogenide films (also referred to herein as metal-dichalcogenide films). The films can have one or more metal and/or one or more chalcogenide. The films comprise one or more monolayers of a metal-chalcogenide disposed on (i.e., in contact with) a substrate. The films exhibit desirable spatial uniformity and/or electrical performance. The films are crystalline. The films comprise 1 to 10 metal-chalcogenide monolayers.

In an aspect, the present disclosure provides a method of making the metal-chalcogenide films. The methods are based on low metal precursor concentration relative to the concentration of chalcogenide precursor. The methods are based on a layer-by-layer growth mode. In an embodiment, the films are formed by a method of the present disclosure.

In an embodiment, a method for making the metal-chalcogenide films on a substrate comprise: contacting a metal precursor, a chalcogenide precursor, a reducing gas (e.g., hydrogen gas), and a substrate in a reactor such that the metal-chalcogenide film is formed on the substrate. The precursors are present at low pressure in the reactor and in the gas phase. The films are not formed by sublimation of a precursor.

In an aspect, the present disclosure provides uses of the metal-chalcogenide films of the present disclosure. The films can be used in a variety of devices. In an embodiment, a device (e.g., an electronic device) comprises one or more metal-chalcogenide film of the present disclosure. The films can be used in, for example, transistors, P-N junctions, logic circuits, analog circuits. Examples of devices include, but are not limited to, lasers, photo-diodes, optical modulators, piezoelectric devices, memory devices, and thin film transistor on transparent substrates. The films can provide a functionality of a device. For example, the films can be used in transistors, P-N junctions, logic circuits, and analog circuits in devices such as, but not limit to lasers, photo-diodes, optical modulators, piezoelectric devices, memory devices, and thin film transistors. In an embodiment, an optical fiber comprises one or more metal-chalcogenide film of the present disclosure. For example, the optical fiber can be used in an optical modulator.

BACKGROUND OF THE DISCLOSURE

The large scale growth of semiconducting thin films is the basis of modern electronics and optoelectronics. Reducing film thickness to the ultimate limit of the atomic, sub-nanometer length scale, a difficult limit for traditional semiconductors (e.g., Si and GaAs), would bring wide benefits for applications in ultrathin and flexible electronics, photovoltaics and display technology. For this, transition metal dichalcogenides (TMDs), which can form stable three-atom-thick monolayers (MLs), provide semiconducting materials with high electrical carrier mobility, and their large-scale growth on insulating substrates would enable batch fabrication of atomically-thin high-performance transistors and photodetectors on a technologically relevant scale without film transfer. In addition, their unique electronic band structures provide novel ways to enhance the functionalities of such devices, including the large excitonic effect, bandgap modulation, indirect-to-direct bandgap transition, piezoelectricity and valleytronics. However, the large-scale growth of ML TMD films with spatial homogeneity and high electrical performance remains an unsolved challenge.

Existing growth methods for large-scale ML TMDs have so far produced materials with limited spatial uniformity and electrical performance. For instance, the sulphurization of metal or metal compounds only provides control over the average layer number, producing spatially-inhomogeneous mixtures of mono-, multi-layer and no-growth regions. While chemical vapour deposition (CVD) based on solid-phase precursors (e.g. $MoO_3$, $MoCl_5$, or $WO_3$) has demonstrated better thickness control over large scale, the electrical performance of the resulting material, which is often reported from a small number of devices in selected areas, fails to show spatially uniform high carrier mobility.

BRIEF DESCRIPTION OF THE FIGURES

For a fuller understanding of the nature and objects of the disclosure, reference should be made to the following detailed description taken in conjunction with the accompanying figures.

DETAILED DESCRIPTION OF THE DISCLOSURE

Figure 1:
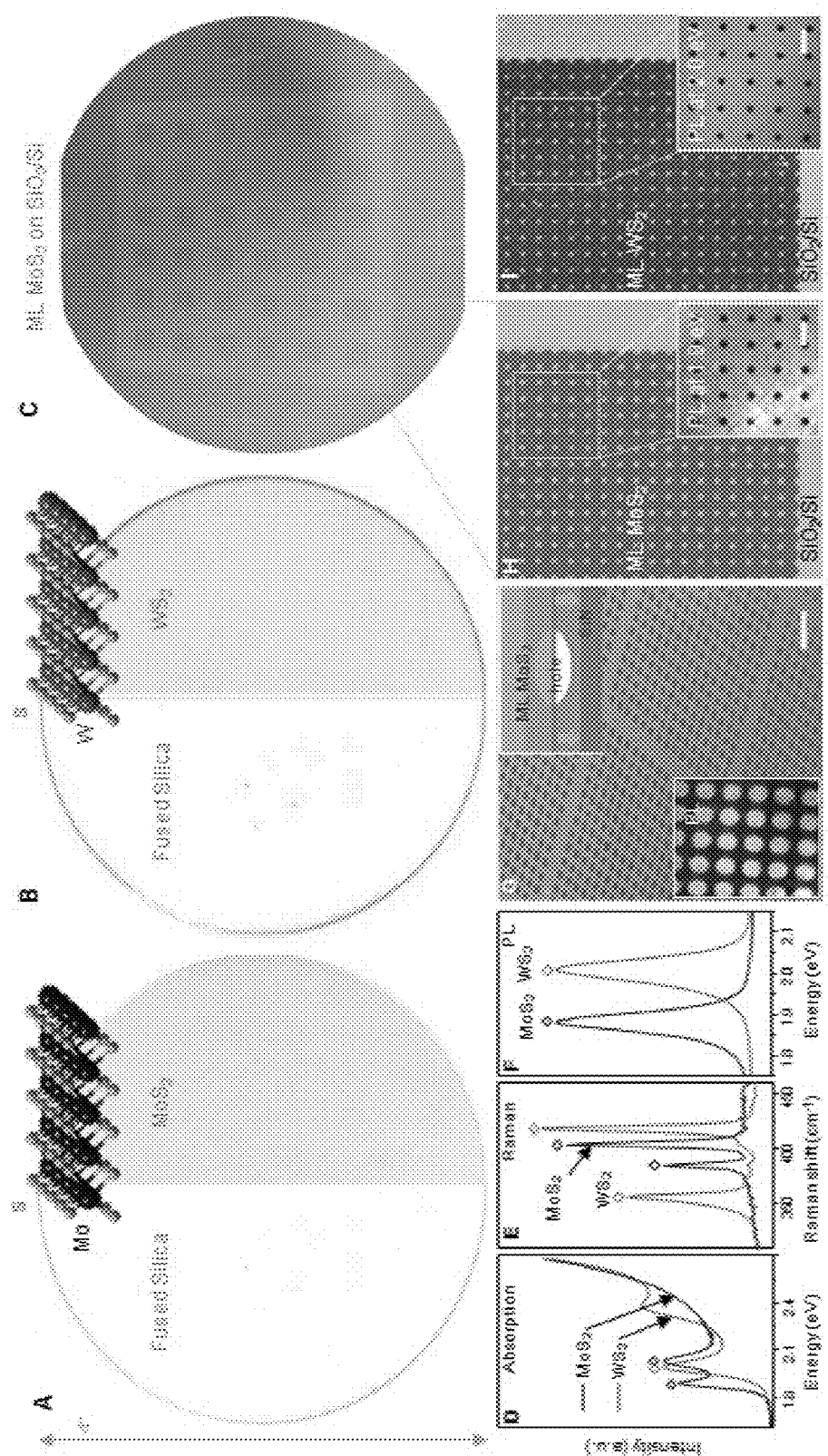
FIG. 1. Wafer scale ML TMD films. a-b, Photo of ML $MoS_2$ (a) and $WS_2$ (b) film grown on 4-inch fused silica substrate with schematics for their respective atomic structure. Left half shows bare fused silica substrate for comparison. c, Photo of patterned ML $MoS_2$ film on 4-inch $SiO_2$/Si wafer (the darker areas are covered by $MoS_2$). d, Optical absorption spectra of MOCVD grown ML $MoS_2$ and $WS_2$ films in the photon energy range from 1.6 to 2.7 eV. e, Raman spectra of as-grown ML $MoS_2$ and $WS_2$, normalized to the silicon peak intensity. f, Normalized photoluminescence (PL) spectra of as-grown ML $MoS_2$ and $WS_2$. The peak positions are consistent with those seen from exfoliated samples, denoted by diamonds, same for d-f g, SEM image and PL image (bottom inset, at 1.9 eV) of ML $MoS_2$ membranes suspended over SiN TEM grid with 2-μm-sized holes (schematic of suspended film in the top inset). Scale bar, 10 μm. h-i, Optical images (normalized to the bare substrate region) and PL images (inset, at 1.9 eV for $MoS_2$ and 2.0 eV for $WS_2$) of patterned ML $MoS_2$ and $WS_2$, respectively on $SiO_2$, taken from the wafer scale patterned films. Scale bar, 10 μm.

The present disclosure provides metal-chalcogenide films comprising one or more monolayers of a metal-chalcogenide on a substrate. Also provided are methods of making the films and using the films.

Disclosed is, for example, high-mobility, 4-inch wafer-scale films of ML molybdenum disulphide (MoS$_2$) and tungsten disulphide (WS$_2$), directly grown on insulating SiO$_2$ substrates, with desirable spatial homogeneity over the entire films. The films are grown using a novel metal-organic chemical vapour deposition (MOCVD) technique, and show desirable electrical performance, including an electron mobility of 30 cm$^2$/Vs at room temperature and 114 cm$^2$/Vs at 90 K for MoS$_2$, with little position or channel-length dependence. Using these films, the wafer-scale batch fabrication of high-performance ML MoS$_2$ field effect transistors (FETs) was demonstrated with a 99% device yield and the multi-level fabrication of vertically-stacked transistor devices for three-dimensional circuitry. This work represents an important step toward the realization of atomically-thin integrated circuitry.

In an aspect, the present disclosure provides metal-chalcogenide films. The films can also be referred to as metal-dichalcogenide films. The films can have one or more metal and/or one or more chalcogenide. The metal is Sc, Ti, V, Cr, Mn, Fe, Co, Ni, Nb, Mo, W, or a combination thereof. For example, the films are chromium-, titanium-, molybdenum-, or tungsten-chalcogenide (e.g., sulfide, selenide, telluride, or a combination thereof) films. The films comprise one or more monolayers of a metal-chalcogenide disposed on (i.e., in contact with) a substrate. The films exhibit desirable spatial uniformity and/or electrical performance. The films can be made by a method disclosed herein. Accordingly, in an example, a film is made by a method disclosed herein.

The films are crystalline. The films comprise 1 to 10 metal-chalcogenide monolayers. In various embodiments, the film comprises 1, 2, 3, 4, 5, 6, 7, 8, 9, 10, monolayers. The films have a grain size of, for example, 100 nm to 100 microns, including all nm values and ranges therebetween. The grains are laterally connected at the grain boundaries. Little or no grain boundary resistance is observable. The grain boundary resistance can be measured by methods known in the art. For example, example grain boundary resistance is evaluated by fabricating electronic device across the grain boundary, which is identified by transmission electron microscope imaging, and measuring the total conductance.

The films can have a wide range of area and form factors. The area and form factor of the film is based on the application and/or the fabrication reactor. For example, the films disposed on a discrete (i.e., not continuous) substrate have an area of 100 square microns to about 50,700 square centimeters (254 cm diameter circular substrate). The films are conformal. The films may be continuous. In an embodiment, the substrate is a 4 inch diameter substrate.

The films provide at least a monolayer thick film across substantially all of the substrate (e.g., the portion(s) of the substrate that are desired to be coated with the film). For example, the films provide at least a monolayer thick across 80% or greater, 90% or greater, 95% or greater, 99% or greater of the substrate that is covered by the film. In another example, the films are a monolayer thick across 100% of the substrate that is covered by the film. In an embodiment, the films provide a 1 to 10 monolayer thick film across 80% or greater, 90% or greater, 95% or greater, 99% or greater of the substrate that is covered by the film. In another embodiment, the films are 1 to 10 monolayers thick across 100% of the substrate that is covered by the film. In various embodiments, the monolayer or monolayers are structurally and/or electrically continuous across 80% or greater, 90% or greater, 95% or greater, 99% or greater of the substrate that is covered by the film. For example, depending on growth time, film coverage ($\theta=1$ is monolayer) can be changed from $0<\theta \leq 1$ (e.g., as shown in FIGS. 2b and c) and no defects are observed (e.g., the defect level is under instrument resolution, for example, according to XPS (e.g., FIG. 6) and STEM (FIG. 2F)) when film coverage $\theta=1$.

The films have desirable characteristics. For example, the films have a desirable level of defects (e.g., less than 10 ppm). Examples of defects include grain boundaries and atom vacancies. For example, the films have desirable mobility (e.g., at least 50 cm$^2$V$^{-1}$ s$^{-1}$ at room temperature and at least 130 cm$^2$V$^{-1}$ s$^{-1}$ at 90 K).

A variety of substrates can be used. The substrates may be planar or non-planar. The substrate may be crystalline or amorphous. The substrate may be a fiber. The substrate may be continuous (i.e., a roll).

Examples of suitable substrates include silicon (e.g., with a native silicon oxide layer or silicon dioxide layer (e.g., PECVD or evaporated silicon dioxide layer)), quartz, fused silica, mica, silicon nitride, boron nitride, alumina, and hafnia. Suitable substrates are commercially available or can be fabricated by methods known in the art.

In an aspect, the present disclosure provides a method of making the metal-chalcogenide films. The methods are based on low metal precursor concentration relative to the concentration of chalcogenide precursor. The methods are based on a layer-by-layer growth mode. In an embodiment, the films are formed by a method of the present disclosure.

In an embodiment, a method for making the metal-chalcogenide films on a substrate comprise: contacting a metal precursor, a chalcogenide precursor, a reducing gas (e.g., hydrogen gas), and a substrate in a reactor such that the metal-chalcogenide film is formed on the substrate. The precursors are present at low pressure in the reactor and in the gas phase. The films are not formed by sublimation of a precursor.

The metal precursor provides a source of metal for film formation. Examples of suitable metal precursors include metal carbonyl compounds. Examples of suitable Mo precursors include Mo(CO)$_6$, C$_{22}$H$_{22}$MO$_2$O$_6$, C$_{16}$H$_{10}$Mo$_2$O$_6$, C$_{10}$H$_{10}$Cl$_2$Mo, C$_{11}$H$_8$MoO$_4$, and combinations thereof. Examples of suitable W precursors include W(CO)$_6$, C$_{18}$H$_{26}$I$_2$W, (C$_4$H$_9$NH)$_2$W(C$_4$H$_9$N)$_2$, ((CH$_3$)$_3$CN)$_2$W(N(CH$_3$)$_2$)$_2$, ((CH$_3$)$_3$CN)$_2$W(N(CH$_3$)$_2$)$_2$, C$_{10}$H$_{10}$Cl$_2$W, C$_{10}$H$_{12}$W, (C$_5$H$_4$CH(CH$_3$)$_2$)$_2$WH$_2$, C$_8$H$_6$O$_3$W, C$_{12}$H$_{12}$O$_4$W, (NH$_3$)$_3$W(CO), and combinations thereof. Examples of suitable metal precursors include the aforementioned metal precursors where the metal is Sc, Ti, V, Cr, Mn, Fe, Co, Ni, Nb, or a combination thereof.

The chalcogenide precursor provides a source of chalcogenide (e.g., sulfide, selenide, or telluride) for film formation. In an embodiment, the chalcogenide precursor has one of the following structures:
$(C_xH_y)_zS$, $(C_xH_y)_zSe$, or $(C_xH_y)_zTe$, where $1 \le x \le 10$, $1 \le y \le 20$, $0 < z \le 2$, x and y are integers, z is an integer or fraction of an integer.

Examples of suitable chalcogenide precursors include alkyl chalcogenide precursors (e.g., dialkylsulfide precursors, dialkylselenide precursors, and dialkyltelluride precursors). For example, the alkyl groups on the precursors are individually selected from methyl groups and ethyl groups. Examples of suitable precursors include dimethylsulfide, dimethylselenide, dimethyltelluride, diethylsulfide, diethylselenide, diethyltelluride, methylethylsulfide, methylethyl selenide, and methylethyltelluride.

Additional examples of metal precursors and chalcogenide precursors include:

| | $E_g$ (eV) | Metal Precursors | Chalcogenide Precursors |
|---|---|---|---|
| $MoS_2$ | 1.8~1.9 | $Mo(CO)_6$ | $(C_2H_5)_2S$ |
| $WS_2$ | 1.9~2.0 | $W(CO)_6$ | $(C_2H_5)_2S$ |
| $MoSe_2$ | 1.5~1.6 | $Mo(CO)_6$ | $(C_2H_5)_2Se$, $(CH_3)_2Se$ |
| $WSe_2$ | 1.7 | $W(CO)_6$ | $(C_2H_5)_2Se$, $(CH_3)_2Se$ |
| $MoTe_2$ | 1.1 | $Mo(CO)_6$ | $(C_2H_5)_2Te$, $(CH_3)_2Te$ |
| $WTe_2$ | 1.1~1.2 | $W(CO)_6$ | $(C_2H_5)_2Te$, $(CH_3)_2Te$ |
| $CrS_2$ | 1.1 | $Cr(CO)_6$ | $(C_2H_5)_2S$ |
| $CrSe_2$ | 0.86 | $Cr(CO)_6$ | $(C_2H_5)_2Se$, $(CH_3)_2Se$ |
| $CrTe_2$ | 0.60 | $Cr(CO)_6$ | $(C_2H_5)_2Te$, $(CH_3)_2Te$ |
| $NiS_2$ | 0.51 | $Ni(C_5H_5)_2$ | $(C_2H_5)_2S$ |
| $TiS_2$ | Metallic | $TiCl_4$, $Ti[OCH(CH_3)_2]_4$ | $(C_2H_5)_2S$ |
| $TaS_2$ | Metallic | $(CH_3CH_2O)_5Ta$ | $(C_2H_5)_2S$ |
| $NbSe_2$ | Metallic | $(CH_3CH_2O)_5Nb$ | $(C_2H_5)_2Se$, $(CH_3)_2Se$ |

The precursors can be present in a carrier gas. For example, the carrier gas is argon, nitrogen or other inert gas. Without intending to be bound by any particular theory, it is considered that use of argon provides desirable film uniformity.

The metal precursor is present (e.g., present in the reactor) at, for example, $1 \times 10^{-6}$ Torr to $1 \times 10^{-2}$ Torr, including all integer Torr values and ranges therebetween. The chalcogenide precursor is present at $1 \times 10^{-5}$ Torr to $1 \times 10^{-1}$ Torr, including all integer Torr values and ranges therebetween. It is desirable that the ratio of metal precursor: chalcogenide precursor be 1:10 to 1:1000, including all integer values and ranges therebetween.

The reducing gas is present at, for example, $1 \times 10^{-4}$ to 10 Torr, including all integer Torr values and ranges therebetween. Examples of suitable reducing gases include hydrogen gas.

It is considered that the presence of water during the fabrication process negatively effects the film forming process. Accordingly, it is desirable that the method is carried out at low water concentration (less than $1 \times 10^{-2}$ Torr). In an embodiment, the method is carried out in the presence of a desiccant. For example, the desiccant is present in a reaction chamber where the method is carried out. Examples of suitable desiccants include NaCl, KCl, or NaBr.

The film forming reaction is carried out at a range of temperatures. For example, the film forming reaction is carried out at 300° C. to 700° C., including all integer ° C. values and ranges therebetween. Film structure (e.g., grain size, morphology, and number of layers) can vary depending on the temperature at which the film forming reaction is carried out. Typically, higher temperatures generate larger grain size and more layers.

The steps of the methods described in the various embodiments and examples disclosed herein are sufficient to make a metal-chalcogenide film of the present disclosure. Thus, in an embodiment, a method consists essentially of a combination of the steps of the method disclosed herein. In another embodiment, a method consists of such steps.

In an aspect, the present disclosure provides uses of the metal-chalcogenide films of the present disclosure. The films can be used in a variety of devices.

In an embodiment, a device (e.g., an electronic device) comprises one or more metal-chalcogenide film of the present disclosure. The films can be used in, for example, transistors, P-N junctions, logic circuits, analog circuits. Examples of devices include, but are not limited to, lasers, photo-diodes, optical modulators, piezoelectric devices, memory devices, and thin film transistor on transparent substrates. The films can provide a functionality of a device. For example, the films can be used in transistors, P-N junctions, logic circuits, and analog circuits in devices such as, but not limit to lasers, photo-diodes, optical modulators, piezoelectric devices, memory devices, and thin film transistors.

In an embodiment, an optical fiber comprises the metal-chalcogenide films of the present disclosure. For example, the optical fiber can be used in an optical modulator.

In the following Statements, various examples of the compositions, methods, and devices of the present disclosure are described:

1. A metal-chalcogenide film disposed on a substrate, the film comprising at least one (e.g., one) monolayer of a metal-chalcogenide.

2. A metal-chalcogenide film of Statement 1, where the metal is Sc, Ti, V, Cr, Mn, Fe, Co, Ni, Nb, Mo, W, or a combination thereof.

3. A metal-chalcogenide film of any one of Statements 1 or 2, where the chalcogenide is S (sulfide), Se (selenide), Te (telluride), or a combination thereof.

4. A metal-chalcogenide film of any one of the preceding Statements, wherein the film comprises (or further comprises) 2 to 10 monolayers of a metal chalcogenide.

5. A metal-chalcogenide film of any one of the preceding Statements, where the film is continuous (e.g., continuous (e.g., structurally and/or electrically continuous) over, for example, 80% or greater, 90% or greater, 95% or greater, or 100% of the substrate that is covered by the film).

6. A metal-chalcogenide film of any one of the preceding Statements, where the substrate is a fiber.

7. A metal-chalcogenide film of any one of the preceding Statements, where the substrate is silicon, silicon with a silicon oxide layer or silicon dioxide layer disposed on at least a portion of a surface of the silicon, quartz, fused silica, mica, silicon nitride, boron nitride, alumina, or hafnia.

8. A method of making a metal-chalcogenide film on a substrate, the film comprising 1 to 10 monolayers of a metal-chalcogenide of any one of the preceding Statements, comprising: contacting a metal precursor, a chalcogenide precursor, a reducing gas, and a substrate in a reactor such that the metal-chalcogenide film is formed (e.g., formed by layer-by-layer growth such as, for example, by forming a first monolayer (e.g., a first monolayer comprising grains that are connected laterally until the first monolayer is formed across about 80% or greater of the substrate covered by the film) and then, optionally a second monolayer), where the precursors (metal precursor and chalcogenide precursor)

are each present in a gas phase and the metal precursor is present at a pressure of $1\times10^{-2}$ Torr or less and the chalcogenide precursor is present at a pressure of $1\times10^{-1}$ Torr or less.

9. A method of making a metal-chalcogenide film on a substrate of Statement 8, where the contacting is carried out in the presence of a desiccant.

10. A method of making a metal-chalcogenide film on a substrate of any one of Statements 8 or 9, where the contacting is carried out at a water concentration of less than $1\times10^{-2}$ Torr.

11. A method of making a metal-chalcogenide film on a substrate of any one of Statements 8 to 10, where the metal precursor has a concentration lower than a concentration of the chalcogenide precursor.

12. A method of making a metal-chalcogenide film on a substrate of any one of Statements 8 to 11, where partial pressures of the metal precursor and the chalcogenide precursor are controlled (e.g., selected) such that a first monolayer is formed (e.g., grains of a first monolayer are connected laterally until the first monolayer is formed across about 80% or greater of the substrate covered by the film).

13. A method of forming a metal-chalcogenide film on a substrate of any one of Statements 8 to 12, further comprising forming a second monolayer on the first monolayer after the first monolayer is formed on about 80% or greater of the substrate covered by the film.

14. A method of forming a metal-chalcogenide film on a substrate of any one of Statements 8 to 13, where the second monolayer is formed on the first monolayer after the first monolayer is formed about 95% or greater of the substrate covered by the film.

15. A device comprising a metal-chalcogenide film of any one of Statements 1 to 8 or a metal-chalcogenide film made by a method of any one of Statements 8 to 14.

16. A device comprising a metal-chalcogenide film of Statement 11, where the device is an electronic device.

17. A device comprising a metal-chalcogenide film of any one of Statements 15 or 16, wherein the device is a laser, a photo-diode, an optical modulator, a piezoelectric device, a memory device, or a thin film transistor.

18. A device comprising a metal-chalcogenide film of any one of Statements 15 or 16, where the device is a transistor, P-N junction, logic circuit, or analog circuit.

19. A device comprising a metal-chalcogenide film of any one of Statements 15 or 16, where the device is an optical fiber.

20. A method of forming a metal-chalcogenide film on a substrate comprising: providing a metal precursor and a chalcogenide precursor into a reactor; and contacting the metal precursor and the chalcogenide precursor to form the metal-chalcogenide film having one or more monolayers of metal chalcogenide on the substrate, where the metal precursor and the chalcogenide precursor in gas phases are provided into the reactor, and wherein partial pressures of the metal precursor and the chalcogenide precursor are controlled such that a first monolayer is formed (e.g., grains of a first monolayer are connected laterally until the first monolayer is formed across about 80% or greater of the substrate covered by the film).

21. A method of forming a metal-chalcogenide film on a substrate of Statement 20, further comprising forming a second monolayer on the first monolayer after the first monolayer is formed on about 80% or greater of the substrate covered by the film.

22. A method of forming a metal-chalcogenide film on a substrate of any one of Statements 20 or 21, where the second monolayer is formed on the first monolayer after the first monolayer is formed about 95% or greater of the substrate covered by the film.

23. A method of forming a metal-chalcogenide film on a substrate of any one of Statements 20 to 22, wherein the first monolayer is continuous.

24. A method of forming a metal-chalcogenide film on a substrate of any one of Statements 20 to 23, where the first monolayer has an area of about 100 square microns or greater.

25. A method of forming a metal-chalcogenide film on a substrate of any one of Statements 20 to 24, where the metal precursor has a concentration lower than a concentration of the chalcogenide precursor.

26. A method of forming a metal-chalcogenide film on a substrate of any one of Statements 20 to 25, further comprising providing a reducing gas into the reactor.

27. A method of forming a metal-chalcogenide film on a substrate of any one of Statements 20 to 26, where a water concentration of the reactor is controlled using a desiccant.

28. A method of manufacturing a device comprising the method of any one of Statements 8 to 14 or 20 to 27.

25. A method of manufacturing a device comprising the method of any one of claims 8 to 14 or 20 to 25, where the device is a device of any one of Statements 15-19.

The following examples are presented to illustrate the present disclosure. They are not intended to limiting in any manner.

Example 1

This example describes the fabrication and characterization of films of the present disclosure.

Figure 5:
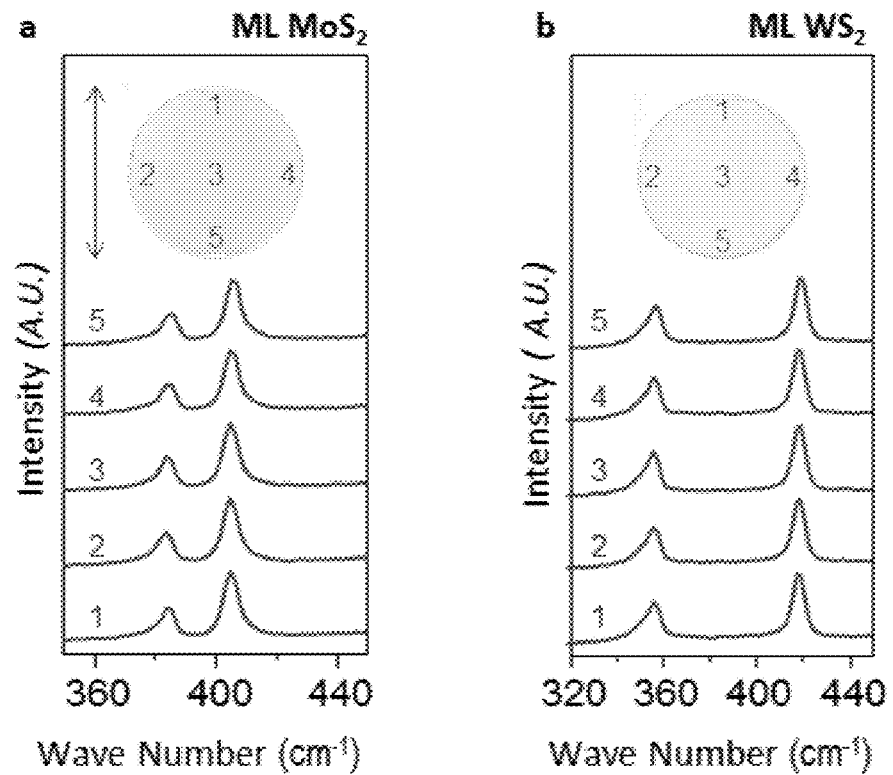
FIG. 5. Raman spectra for MoS$_2$ (a) and WS$_2$ (b) respectively, taken at different locations marked on the corresponding fused silica wafer.
Figure 6:
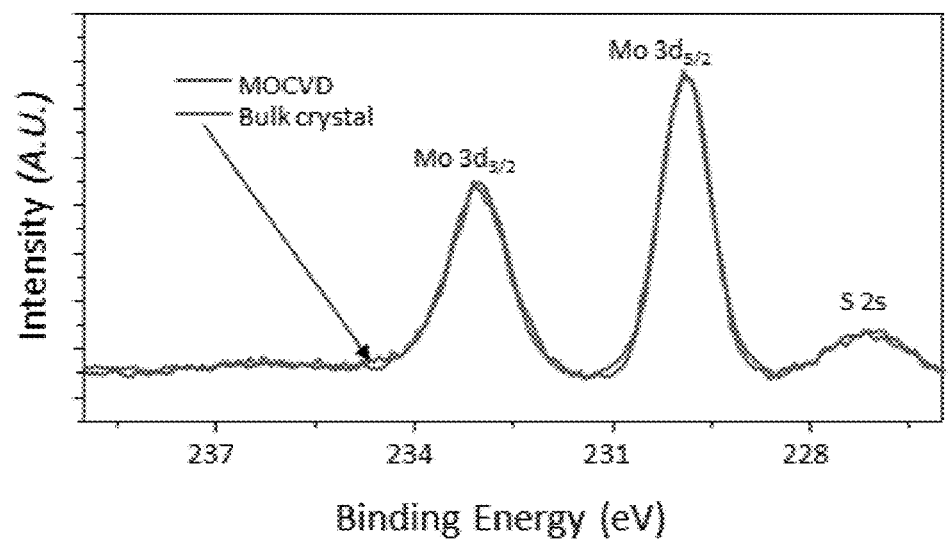
FIG. 6. XPS spectra of a, Mo 3d 3/2, 5/2 and S 2s state for MoS$_2$ grown by our method (light grey) and bulk MoS$_2$ single crystal (grey), where the peak position and FWHM are almost identical. b, C 1s for MoS$_2$ grown by our method (light grey), bare SiO$_2$/Si substrate after solvent cleaning (grey) and bulk single crystal (darker grey), where all three sample show similar peak area of C 1s, which means our films do not contain significant carbon residue after MOCVD process (curves shifted from the bottom for clarity).
Figure 6:
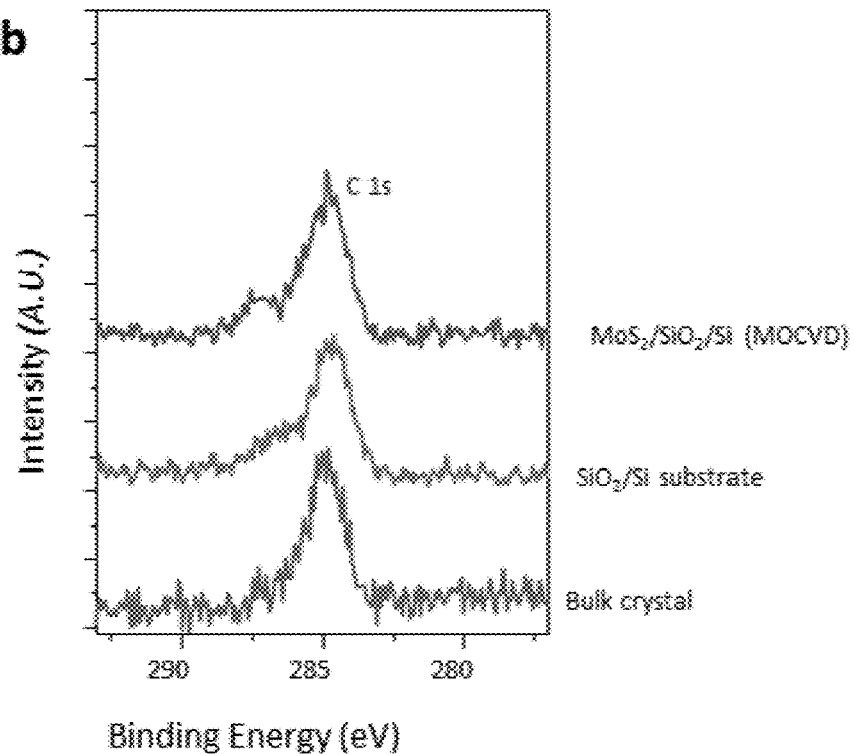

The growth of semiconducting ML films of $MoS_2$ and $WS_2$ on silicon oxide on a 4-inch wafer scale is described, with both desirable electrical performance and structural continuity, maintained uniformly over the entire films. FIG. 1 shows continuous TMD ML films and shows their wafer-scale homogeneity and intrinsic optical properties. The photos of $MoS_2$ (FIG. 1a; grey) and $WS_2$ (FIG. 1b; light grey) films grown on a transparent 4-inch fused silica wafer show that the TMD grown region (right half) is uniform over the whole substrate and clearly distinguishable from the bare silica substrate (left half). The optical absorption, photoluminescence (PL), and Raman spectra measured from our films show characteristics unique to ML $MoS_2$ and $WS_2$, respectively (FIG. 1d-f). All of these measured spectra have the same peak positions as in exfoliated ML samples (denoted by diamonds), regardless of the location of the measurements within our films (FIG. 5). The X-ray photoelectron spectra (XPS) taken from our ML $MoS_2$ film show almost identical features as in bulk single crystal with low level of defects, further confirming the precise chemical composition and the high quality of our $MoS_2$ film (FIG. 6).

FIG. 1c shows a photo of a $MoS_2$ film grown on a 4-inch $SiO_2$/Si wafer. The ML film was patterned using standard photolithography and oxygen plasma etching to form $MoS_2$ covered squares (dark, 6 mm wide) with an array of 3 μm holes. A zoomed-in, normalized optical reflection image (FIG. 1h) displays a homogeneous reflection contrast for the entire $MoS_2$ covered region, confirming uniform ML growth everywhere with no gaps. In addition, FIG. 1g shows a scanning electron microscope (SEM) image of an array of fully-suspended ML $MoS_2$ membranes (2 μm in diameter) fabricated by transferring our MOCVD-grown film onto a SiN grid with holes. Its high fabrication yield (>99.5%) suggests mechanical strength and continuity of the film. The widefield PL images of these films (insets, FIGS. 1g and 1h) show strong, spatially uniform PL signals, further confirming that they are continuous ML $MoS_2$, with its high quality maintained even after patterning or transfer. The same spatial uniformity was seen in the optical reflection and PL images of a ML $WS_2$ film that was similarly grown and patterned (FIG. 1i). Together, the data in FIG. 1 confirm that the $MoS_2$ and $WS_2$ films are continuous MLs, spatially uniform over the entire 4-inch growth substrates with intrinsic optical properties. Below, using $MoS_2$ as the main example, the growth (FIG. 2) and the excellent electrical properties (FIG. 3) of these MOCVD-grown films is discussed.

Figure 2:
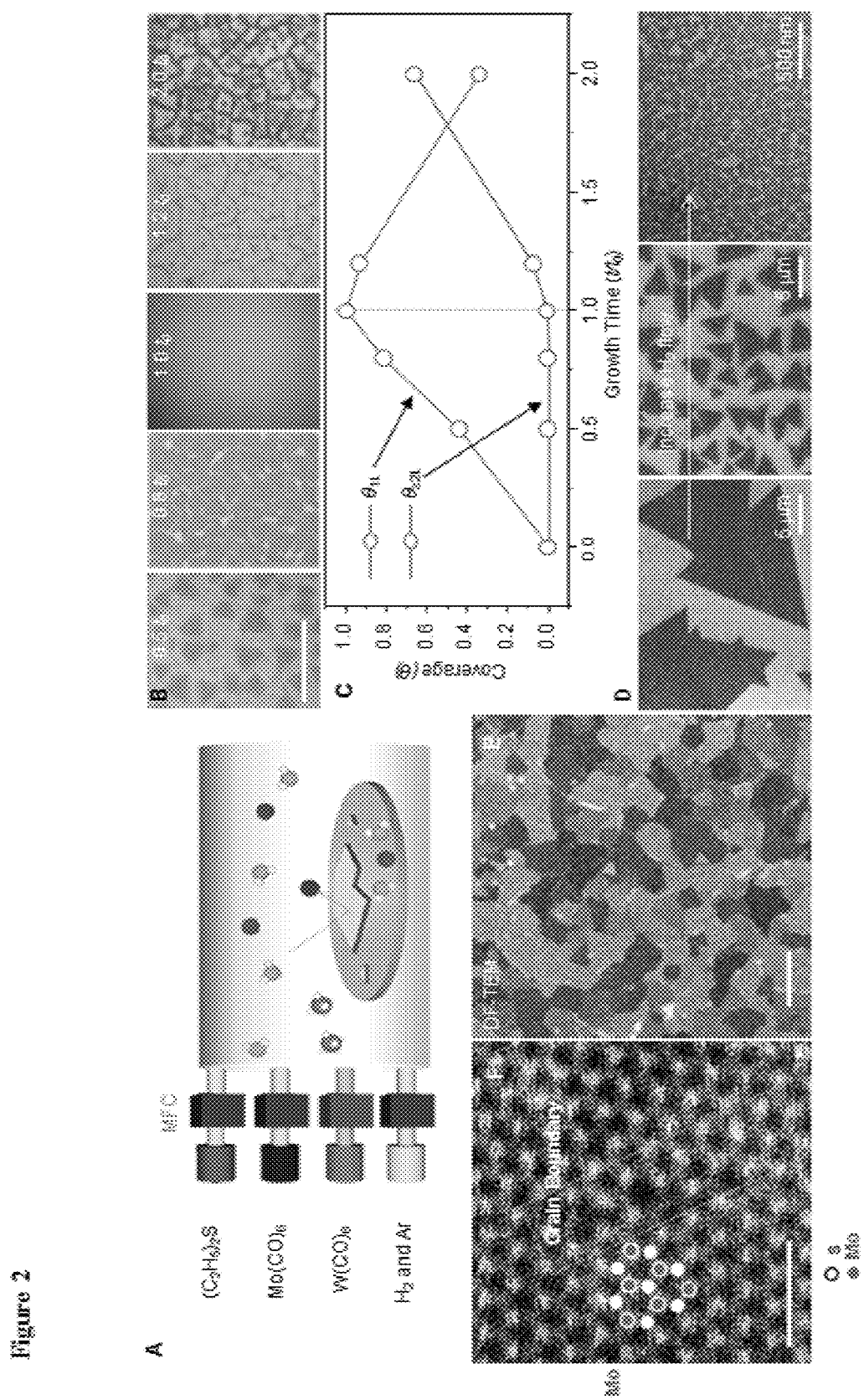
FIG. 2. MOCVD growth of continuous ML MoS$_2$ film. a, Schematic of our MOCVD growth setup. Precursors are introduced to the growth setup using individual mass flow controllers (MFCs). Dark grey=Mo or W atom, light grey=S, white=carbonyl or ethyl ligands. b, Optical images of MOCVD-grown MoS$_2$ at different growth times, where $t_0$ is the optimal growth time for full ML coverage. Scale bar, 10 µm. c, Coverage ratio for ML ($\theta_{1L}$) and multi-layer region ($\theta_{\geq 2L}$) as a function of growth time. d, Grain size variation of ML MoS$_2$ depending on the hydrogen flow rate from left to right; 5 sccm (SEM image shown), 20 sccm (SEM) and 200 sccm (TEM). e, False-colour DF-TEM image showing a continuous ML MoS$_2$ film. Scale bar, 1 µm. f, ADF-STEM image of a laterally-stitched grain boundary in a ML MoS$_2$ film, with grey and white dots representing the Mo and S atoms, respectively. Scale bar, 1 nm.

FIG. 2a schematically explains our MOCVD growth, where gas-phase precursors of $Mo(CO)_6$, $W(CO)_6$, $(C_2H_5)_2S$, and $H_2$, all diluted in Ar as a carrier gas are used. The concentration of each reactant can be precisely controlled during the entire growth time by regulating the partial pressure (Px) of each reactant (X). Thus the setup offers a desirable environment for maximizing the areal coverage of the ML, and for engineering the film structure by controlling the nucleation density and intergrain stitching. FIG. 2 summarizes the results.

Figure 9:
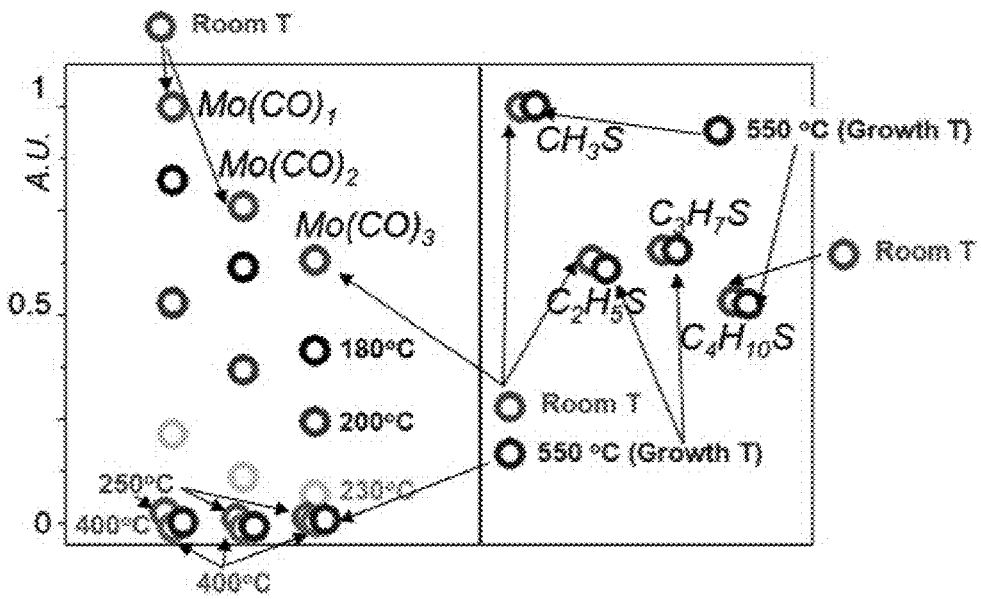
FIG. 9. Normalized intensity of residual gas signal for Mo(CO)$_x$ and C$_x$H$_y$S depending on temperature. Each dot corresponds to a temperature, as denoted in the figure.
Figure 10:
FIG. 10. Morphology change of MOCVD-grown MoS$_2$ depending on the growth parameters. In order to show grain size clearly, we intentionally grow partially covered MoS$_2$. a, salt (desiccant) dependence of grain size. b, DES flow rate dependence of grain size. c, high Mo vapour concentration environment, where a mixture of monolayer, multilayer and no-growth regions exist.
Figure 10:
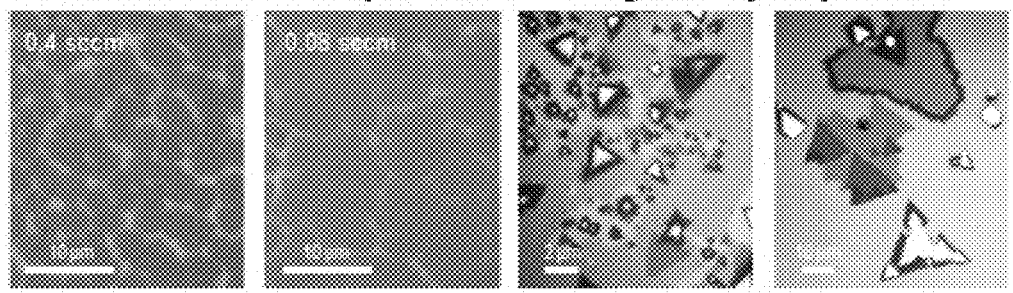
Figure 11:
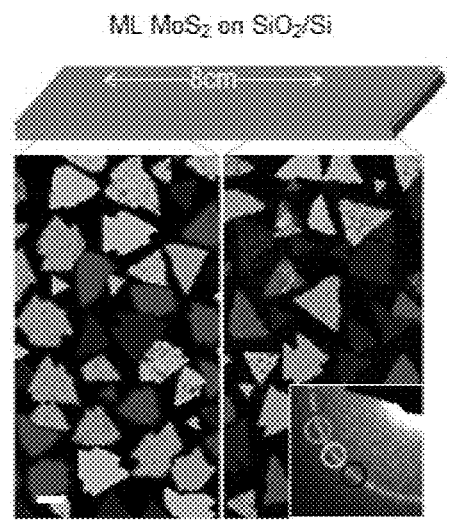
FIG. 11. False-colour DF-TEM image of MoS$_2$ grown at two locations 8 cm apart, where the identical grain size and nucleation density suggests the homogeneous nucleation over the whole growth area. Scale bar, 100 nm.

First, the $MoS_2$ film is grown in the layer-by-layer growth mode, which is important for the uniform layer control over large scale. FIG. 2c plots the areal coverage of ML ($\theta_{1L}$) and multilayer ($\theta_{\geq 2L}$; mostly bilayer) regions measured from our $MoS_2$ grown on $SiO_2/Si$ along with optical images (FIG. 2b) at different growth times. It shows the initial nucleation on the $SiO_2$ surface ($t=0.5\ t_0$), subsequent ML growth near (0.8 $t_0$) and at the maximum ML coverage ($t_0$), followed by nucleation mainly at grain boundaries (1.2 $t_0$) and bilayer growth (2 $t_0$). Significantly, no nucleation of second layer while the first layer is forming ($\theta_{\geq 2L} \sim 0$ when $t<t_0$) was observed, producing an optimal growth time to near full ML coverage ($\theta_{1L}\sim 1$). Additional PL and electron microscope images taken after different growth times further suggest that the edge attachment is the main mechanism for the ML growth after nucleation and that the neighboring ML grains are uniformly connected by tilt grain boundaries with enhanced PL at $t=t_0$ (see, FIG. 7, FIG. 8). The standard thin film growth model suggests this growth mode is effective below a certain deposition rate of the growth species, above which it suggests a different mode that forms thicker islands. Indeed, the layer-by-layer growth of $MoS_2$ film was observed only when a low partial pressure ($P_{Mo}\sim 10^{-4}$ Torr in FIGS. 2b and 2c) of Mo vapour (produced by thermal decomposition of $Mo(CO)_6$; see FIG. 9) was applied under the presence of excess $(C_2H_5)_2S$. In contrast, the growth at a higher $P_{Mo}$ is no longer in the layer-by-layer growth mode, instead producing a mixture of ML, multilayer, and no growth regions simultaneously (FIG. 10). For the uniform ML growth over a large substrate, it is thus important to maintain a low $P_{Mo}$ constantly over the entire growth region and over time, the key technical capability provided by our MOCVD setup (see FIG. 11 for the spatially homogeneous ML nucleation over multi-inch scale).

Second, the grain structure of our $MoS_2$ film, including the average grain size and the intergrain connection, depends sensitively on the concentrations of $H_2$, $(C_2H_5)_2S$ as well as residual water. As a representative example, FIG. 2d shows the two main effects of $H_2$, whose presence is necessary for removing carbonaceous species generated during the MOCVD growth: (i) the average grain size increases from hundreds of nm to over 10 µm with decreasing $H_2$ flow, and (ii) the $MoS_2$ grains grown under higher $H_2$ flow (FIG. 2d, right image) have mostly perfect triangular shapes without merging with neighbouring grains, a trend that disappears with lower $H_2$ flow (left and middle images). These observations are consistent with the $H_2$ induced decomposition of $(C_2H_5)_2S$ (increasing nucleation due to hydrogenolysis), and the etching of the $MoS_2$ (preventing intergrain connection) as previously reported (for further discussion on the effects of $(C_2H_5)_2S$ and water, see FIG. 10). In order to grow continuous ML $MoS_2$ with large grain size and high-quality intergrain stitching, we thus flow optimal amounts of $H_2$ and $(C_2H_5)_2S$ and dehydrate the growth environment.

Figure 12:
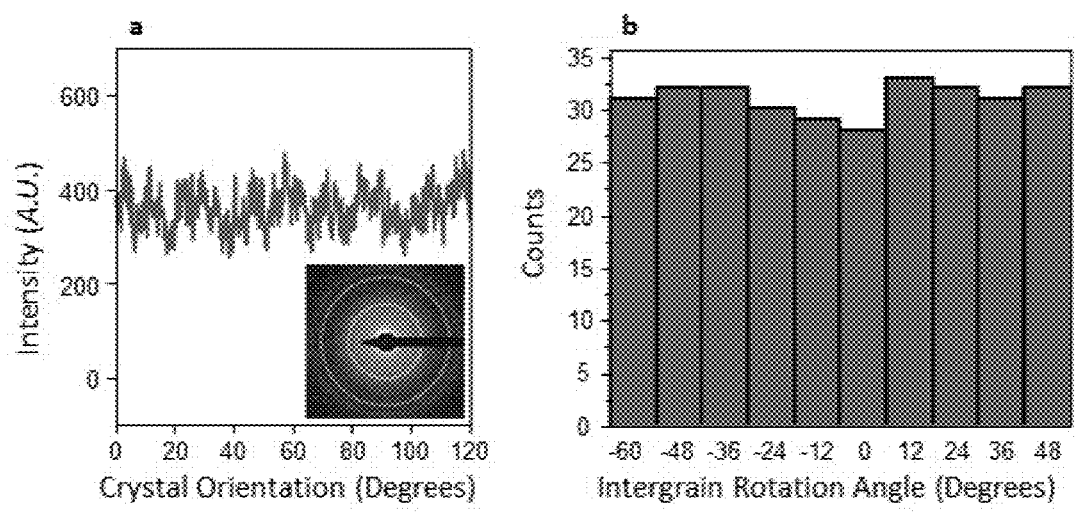
FIG. 12. a, A polar plot of the electron diffraction intensity (diffraction map shown in the inset) measured from a large area ML MoS$_2$ (inset), indicating a uniform angular distribution of the MoS$_2$ crystal orientation. It is generated by averaging the diffraction intensity from the three equivalent angular domains, each spanning 120 degrees. b, A histogram of intergrain rotation angles measured from all grain boundaries found in the ML MoS$_2$ sample shown in FIG. 2e, suggesting no preferred intergrain tilt angle. For this, the crystal orientation for every MoS$_2$ grain was first obtained from five DF-TEM images taken with different objective aperture locations (each centred at 0°, 12°, 24°, 36° and 48°, respectively). In each DF-TEM image taken at an objective aperture location θ, we assign the crystal orientation of θ (for brighter regions; from aligned Mo sub-lattice) or θ-60° (for less bright regions; from aligned S sub-lattice). The intergrain rotation angles were extracted using these assignments and range between −60° to 60° (with ±6° error).
Figure 13:
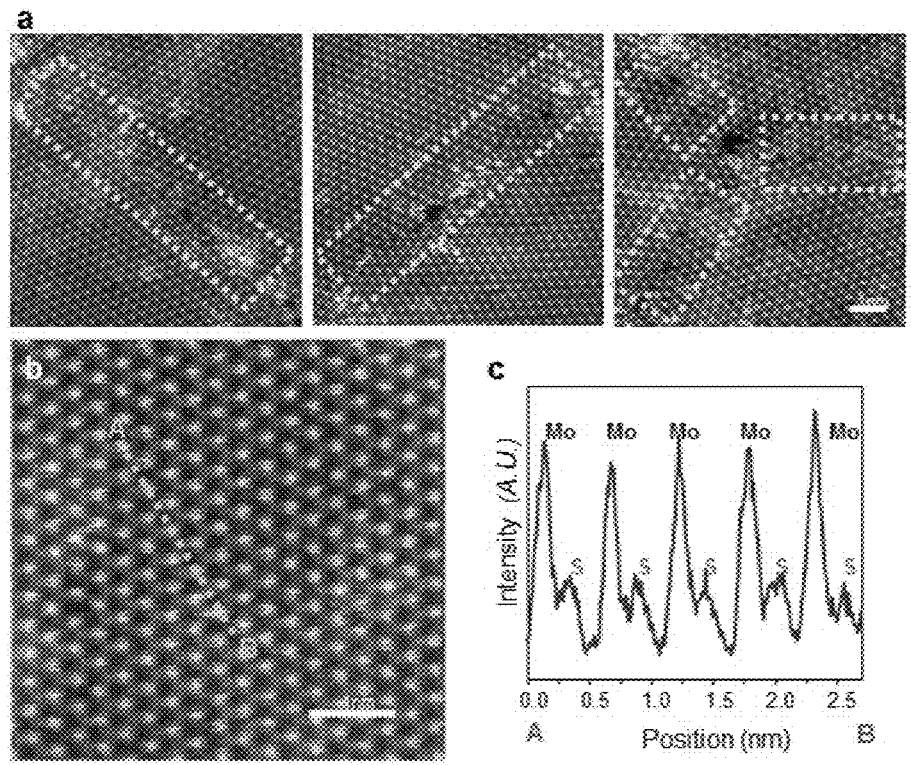
FIG. 13. a, ADF-STEM images of laterally-stitched grain boundaries in a ML MoS$_2$ film. The sub nanometer holes come from electron beam radiation damage, and the clouds are surface contaminations generated during the transfer process. b, High quality ADF-STEM image of ML MoS$_2$ film and c, corresponding line profile of intensity. The image intensity is roughly proportional to $Z^\gamma$, where Z is the atomic number, and 1.3<γ<2.

The darkfield transmission electron microscope (DF-TEM) and annular darkfield scanning TEM (ADF-STEM) images shown in FIGS. 2e and 2f confirm the structural continuity of our $MoS_2$ film grown under those conditions on the nanometer and atomic length scales. The DF-TEM image shows a continuous polycrystalline ML film with no visible gaps, while having less than 0.5% bilayer area. Further analysis of the DF-TEM and electron diffraction data (see FIG. 12) confirms a uniform angular distribution of crystal orientations with no preferred intergrain tilt angle for grain boundaries. The ADF-STEM data (FIG. 2f, more images shown in FIG. 13) further confirm that adjacent grains are likely to be connected by a high quality lateral connection with similar structures seen in previous reports. The $MoS_2$ films shown in FIG. 1 as well as the ones studied below for their electrical properties in FIG. 3 and FIG. 4 were grown, producing an average grain size of ~1 µm (see FIGS. 2b and 2e). Surprisingly, almost identical growth parameters with $P_W\sim 10^{-4}$ Torr produce ML $WS_2$ films as shown in FIGS. 1b and 1i, indicating the same layer-by-layer growth for $WS_2$ with a similar $t_0$.

Figure 3:
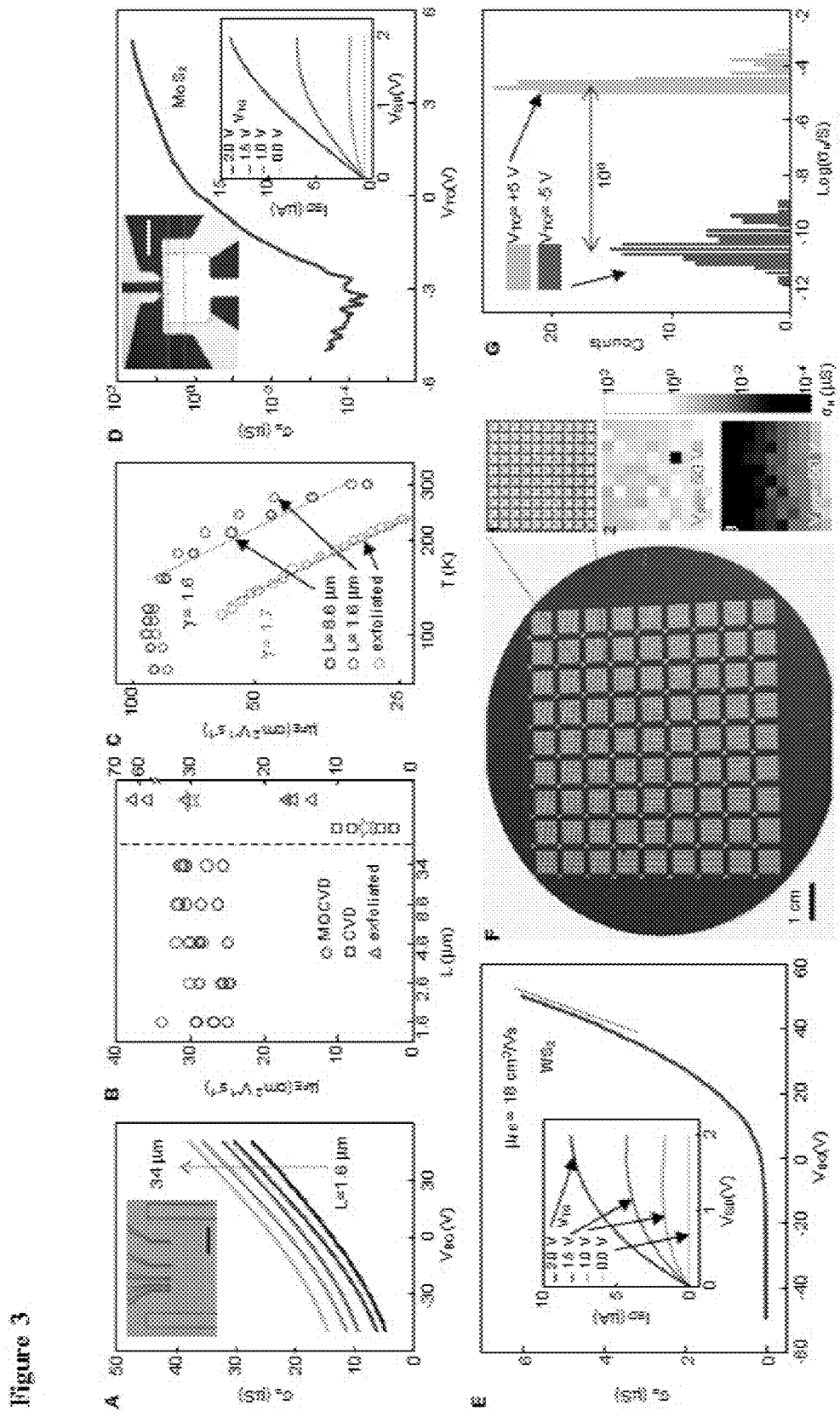
FIG. 3. Electrical characterization and batch fabrication of ML TMD FETs. a, Gate-dependent sheet conductance ($\sigma_\square$) of ML MoS$_2$ FETs measured with different L, the channel length (curves shifted from the bottom for clarity). Inset: optical image of the device, scale bar 10 µm. b, Field effect mobility ($\mu_{FE}$) measured from five MoS$_2$ FETs fabricated at random locations with different L. Data from previous results for CVD-grown and exfoliated samples are shown for comparison (stars indicating their medians). c, Temperature dependence of $\mu_{FE}$ measured from the device in FIG. 3a, and from a previous report on exfoliated samples, both showing the phonon limited intrinsic transport. d, Top gate ($V_{TG}$) dependent $\sigma_\square$ for dual-gate ML MoS$_2$ FET (device shown in upper inset). Lower inset: $V_{TG}$-dependent $I_{SD}$-$V_{SD}$ curves showing current saturation and ohmic electrode contact. Scale bar, 10 µm. e, Gate-dependent $\sigma_\square$ of a ML WS$_2$ FET showing $\mu_{FE}$=18 cm$^2$/Vs. Inset: $V_{TG}$-dependent $I_{SD}$-$V_{SD}$ curves showing current saturation and ohmic electrode contact. f, (Left) Batch fabricated 8,100 MoS$_2$ FET devices on a 4-inch SiO$_2$/Si wafer. f1, Zoom-in image of one square containing 100 devices. f2, f3, Corresponding colour map of $\sigma_\square$ at gate bias $V_{BG}$=50V and −50V respectively, with the black block in f2 representing the only non-conducting device. g, Histogram of on- and off-state $\sigma_\square$ of 100 dual-gate FETs showing a median on-off ratio of $10^6$ and a high on-state conductivity. All measurements were performed at room temperatures except for c.
Figure 14:
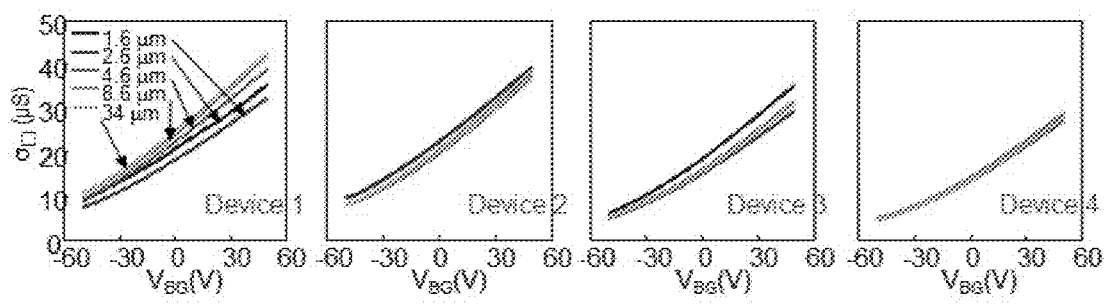
FIG. 14. Gate-dependent $\sigma_\square$ of four multiple-electrode ML MoS$_2$ FETs (same geometry as shown in FIG. 3a inset) separated by up to 3.3 mm.

The electrical properties of our ML $MoS_2$ films display two important characteristics: the spatial uniformity over a large scale and excellent transport properties similar to those seen in exfoliated samples. All our electrical measurements in FIG. 3 and FIG. 4 (except for FIG. 3c) were performed at room temperature. FIG. 3a first shows the sheet conductance ($\sigma_\square$) vs backgate voltage ($V_{BG}$) curves measured from a ML $MoS_2$ FET (optical image shown in the inset) with multiple electrodes for the four-probe measurements (except for channel length (L)=34 m). It includes several curves for different L ranging between 1.6 and 34 µm (shifted from the bottom one for clarity), all of which show nearly identical behaviours, including the n-type conductance, carrier concentration (~$4\times 10^{12}$ cm$^{-2}$ at $V_{BG}=0$ V), and high field effect mobility (FE). FIG. 3b further plots $\mu_{FE}$ measured from five such devices, fabricated at random locations and separated by up to 3.3 mm on a single chip. All the devices show similar $\mu_{FE}$ near 30 cm$^2$/Vs independent of L and device location with similarly uniform $\sigma_\square$-$V_{BG}$ curves (shown in FIG. 14), suggesting the spatial homogeneity of the electrical properties of the $MoS_2$ film at length scales ranging from micrometers to millimeters.

Figure 15:
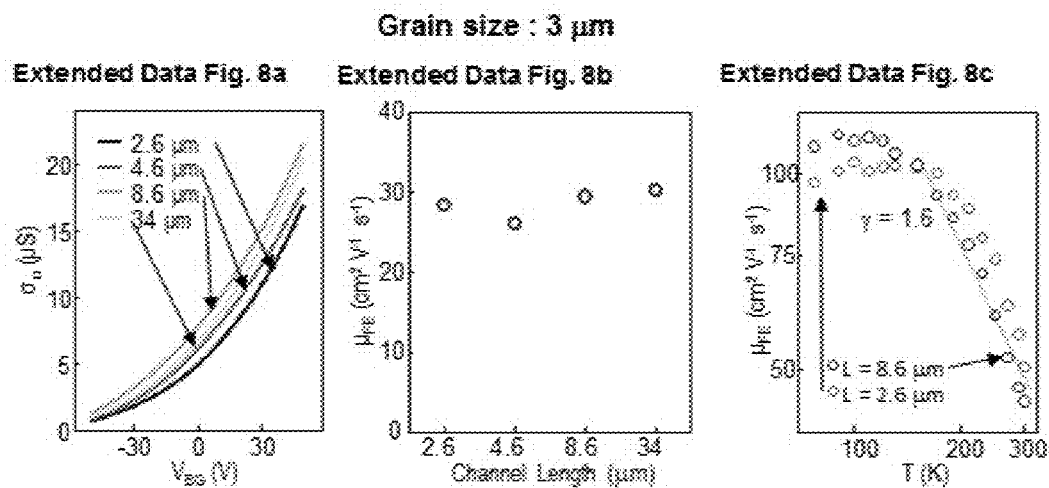
FIG. 15. a, Transfer curves measured from MoS$_2$ of grain size 3 µm with different channel lengths. b, Field effect mobility ($\mu_{FE}$) of different channel lengths extracted from (a). c, Temperature dependence of $\mu_{FE}$ measured from MoS$_2$ film of grain size 3 µm, with different channel lengths, which show the same dependence as shown in FIG. 3c.
Figure 16:
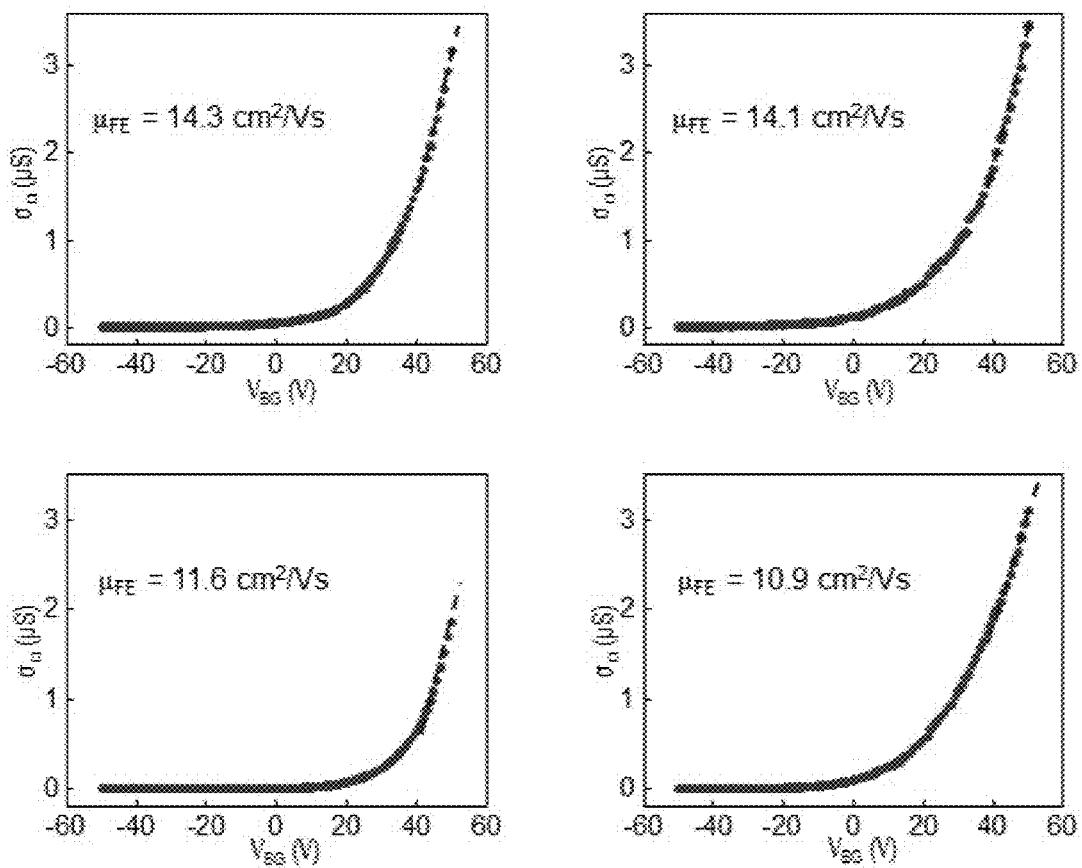
FIG. 16. Gate-dependent two-terminal $\sigma_\square$ of four additional ML WS$_2$ FETs, of which the extracted mobilities are 14.3, 14.1, 11.6 and 10.9 cm$^2$/Vs, respectively.

The distribution of $\mu_{FE}$ of the devices is compared with the results of multiple devices from two previous reports, each measured from individual grains of exfoliated or CVD grown $MoS_2$ samples. Surprisingly, $\mu_{FE}$ measured from our MOCVD film is similar to the median $\mu_{FE}$ (denoted by a star) of exfoliated samples (and several times higher than the CVD results), while displaying a much narrower distribution. In addition, the temperature dependence of FE (FIG. 3c) measured from the same device in FIG. 3a shows higher $\mu_{FE}$ at lower temperatures (92 cm$^2$/Vs at 100K) and the intrinsic, phonon-limited electron transport, similar to the behaviours previously observed in exfoliated samples (shown in FIG. 3c) but different from those observed from a CVD sample with stronger effects from defects. Specifically, our data show the characteristic of $\mu_{FE} \sim T^{-\gamma}$ dependence between 150 and 300K with $\gamma=1.6$, close to the value predicted by theory (1.69) and consistent with results from previous experiments (average value ranging between 0.6 and 1.7) for a similar temperature range. Finally, FIG. 3d shows a high-performance MoS$_2$ FET fabricated with an individual top-gate electrode ($V_{TG}$). It has a high on/off conductance ratio (~10$^6$), current saturation at relatively low bias $V_{SD}$ (lower inset, FIG. 3d), high field effect mobility (~29 cm$^2$/Vs) and large transconductance (~2 µS/m), all of which are comparable to the best reported results. The devices studied in FIG. 3a-3d were fabricated at random locations using a polycrystalline ML MoS$_2$ film, unlike the devices with single-grain samples used for comparison. In addition, the electrical properties measured from a separate ML MoS$_2$ film with a larger average grain size of 3 m (instead of 1 µm in FIG. 3) show almost identical characteristics, including the channel length independence of FE and the phonon-limited transport at T>150K (see FIG. 15; with the low temperature mobility as high as 114 cm$^2$/Vs at 90K). Altogether, our data confirm the spatial uniformity and high electrical performance of our MoS$_2$ FETs independent of the average grain size, which suggests that the inter-grain boundaries in our film do not significantly degrade their electrical transport properties. This is likely due to the formation of well-stitched inter-grain boundaries with a low level of defects, an explanation also supported by the ADF-STEM (FIG. 2f) and XPS data (FIG. 6) discussed earlier. Therefore, our data lead to an important conclusion that our optimized MOCVD growth provides an electrically homogeneous ML MoS$_2$ film. Moreover, we successfully fabricated and measured 60 FETs using a ML WS$_2$ film. Even though the growth of ML WS$_2$ is not carefully optimized, these devices show excellent electrical properties with their $\mu_{FE}$ as high as 18 cm$^2$/Vs at room temperature (FIG. 3e) with the median $\mu_{FE}$ close to 5 cm$^2$/Vs. In addition, the WS$_2$ device in FIG. 3e shows a high on/off ratio of 10$^6$ and the current saturation behaviour (inset, FIG. 3e) as in our MoS$_2$ devices. (FIG. 16 for data from additional ML WS$_2$ FET devices).

Figure 17:
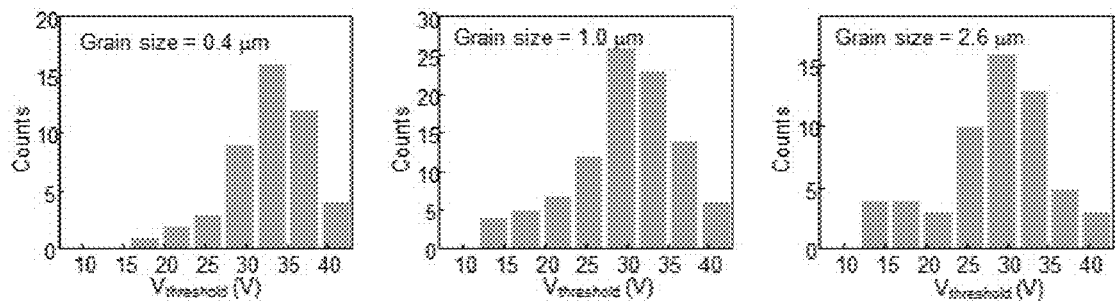
FIG. 17. Histograms of threshold voltage of MoS$_2$ FETs with grain size 0.4, 1.0 and 2.6 µm, respectively.
Figure 18:
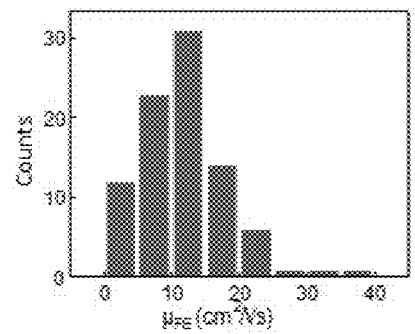
FIG. 18. Statistics for field effect mobility of MoS$_2$ FETs taken from the devices in FIG. 3g.

The structural and electrical uniformity of our MoS$_2$ film enables the wafer-scale batch fabrication of high performance FETs as demonstrated in FIGS. 3f and 3g. FIG. 3f shows a photo of 8,100 MoS$_2$ FETs with a global back gate, which were fabricated on a 4-inch SiO$_2$/Si wafer using a standard photolithography process. FIG. 3f-2 (3f-3) shows the colour-scale map of $\sigma_\square$ measured from 100 MoS$_2$ FETs in one square region at $V_{BG}=+50$ V ($-50$ V) along with the zoomed-in optical image of the devices (FIG. 3f-1). An almost perfect device yield of 99% was observed, only two out of 200 FETs we characterized (including data from an adjacent region) do not conduct. The data also confirm the spatially uniform n-type transistor operation (larger $\sigma_\square$ for positive $V_{BG}$) with similar $V_{BG}$ dependence for all our devices and high on-state device conductance. Similarly uniform $V_{BG}$ dependence from FET devices fabricated using ML MoS$_2$ films with different average grain sizes was also observed, as characterized by the histograms of the threshold voltages (FIG. 17). Similarly, 100 individually addressable dual gate MoS$_2$ FETs (similar to the device in FIG. 3d) were fabricated on another wafer piece. The histogram of the on-state $\sigma_\square$ ($V_{TG}=5$ V; median carrier concentration~$7\times10^{12}$ cm$^{-2}$) and off-state a ($V_{TG}=-5$ V) collected from all such FETs (FIG. 3g) shows strong peaks above 10$^{-5}$ S and near 10$^{-11}$ S, respectively, confirming a uniform conductance switching behaviour with high on-state $\sigma_\square$ (>10 µS) and on-off ratio (~10$^6$). In addition, the majority of these batch-fabricated FETs shows high $\mu_{FE}$ (>10 cm$^2$/Vs, see FIG. 18).

The data presented in FIG. 1-3 confirm the structural and electrical uniformity of the wafer-scale ML MoS$_2$ film grown by the instant MOCVD method. This makes the film compatible with the batch device fabrication processes on a technologically relevant scale. Moreover, as SiO$_2$ provides a substrate for its growth, one can produce high quality ML films on a variety of substrates by depositing SiO$_2$ prior to the growth. This versatility would allow the realization of high performance FETs directly on non-conventional substrates, such as metal and thermally stable plastic. In addition, one can integrate multiple layers of MoS$_2$ devices by repeating the TMD film growth, device fabrication, and SiO$_2$ deposition, which could enable novel three-dimensional circuitry.

Figure 4:
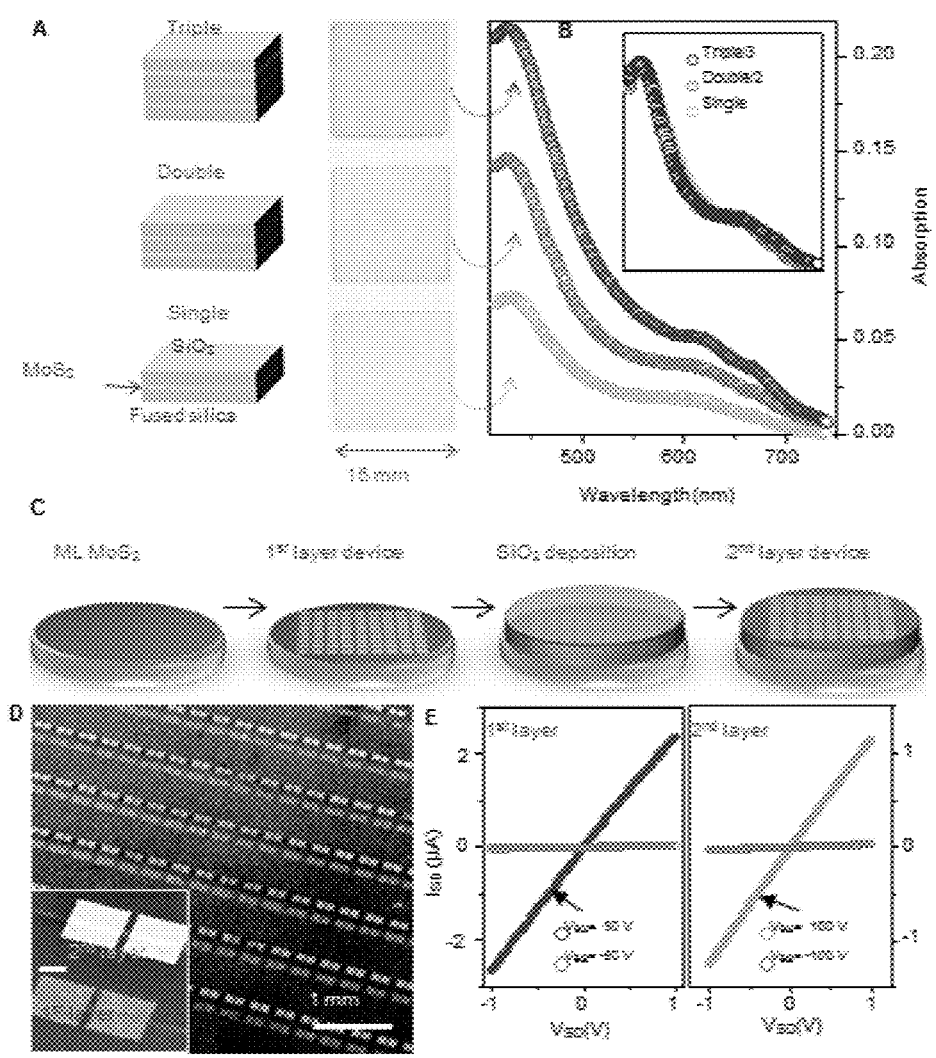
FIG. 4. Multi-stacking of MoS$_2$/SiO$_2$ structure. a, Schematics (left) and optical image (right) of single, double and triple stacking of ML-MoS$_2$/SiO$_2$. b, Optical absorption spectra for single, double and triple stacks, respectively (normalized spectra shown in the inset). c, Schematic for fabrication of MoS$_2$ device/SiO$_2$ stacking using alternating MOCVD growth, device fabrication with photolithography, and SiO$_2$ deposition. See main text for details. d, False-colour SEM image of MoS$_2$ FET arrays on 1$^{st}$ (bottom) and 2$^{nd}$ (top) layer (zoomed-in image of a pair of devices shown in the inset, scale bar 50 µm). e, $I_{SD}$-$V_{SD}$ curves measured from two neighbouring devices on 1$^{st}$ and 2$^{nd}$ layer, respectively, both showing the n-type conductance switching.

In FIG. 4, this potential was demonstrated by producing multi-stacked ML MoS$_2$ films as well as electronic devices fabricated at different vertical levels. FIG. 4a shows the schematics and photos of three substrates each with single, double or triple ML MoS$_2$ films grown at different levels. The first (bottom) ML film was grown on a fused silica substrate while the additional layers were grown on SiO$_2$ (100 nm thick) deposited on the previously grown MoS$_2$ ML using plasma-enhanced CVD (PECVD). The colour of the substrate, which remains uniform for each substrate, becomes darker as the number of layers increases. Their absorption spectra, shown in FIG. 4b, present almost identical absorption at all measured wavelengths, once normalized by the number of stacks grown (see inset), suggesting little degradation of the optical properties of the ML MoS$_2$ films after subsequent oxide deposition and MoS$_2$ growth.

Figure 19:
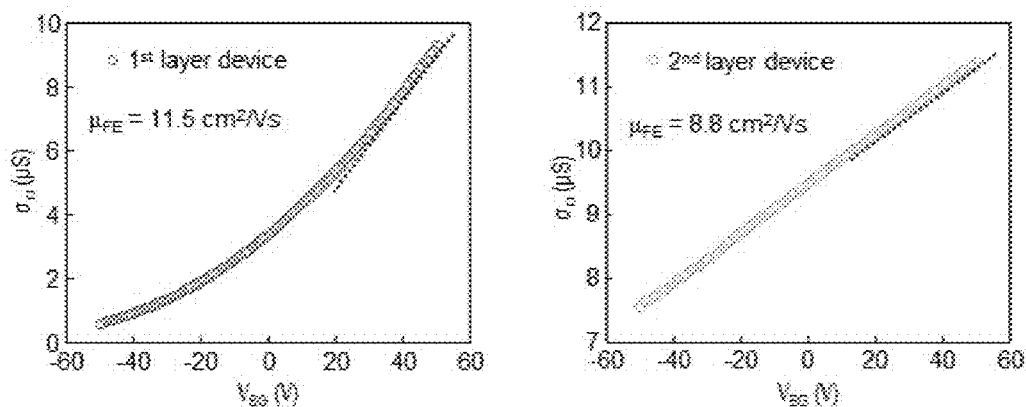
FIG. 19. Gate-dependent $\sigma_\square$ for ML MoS$_2$ FET on 1$^{st}$ and 2$^{nd}$ layer in the multi-stacked device structure. The total gate oxide (SiO$_2$) thickness for 1$^{st}$ and 2$^{nd}$ layer devices are 285 nm and 785 nm, respectively.

FIG. 4c shows the schematics of our multi-stacked device fabrication process: (i) first ML MoS$_2$ growth on a SiO$_2$/Si wafer, (ii) FET fabrication, (iii) deposition of SiO$_2$ (thickness of 500 nm), (iv) second ML MoS$_2$ growth and FET fabrication. A false-colour SEM image in FIG. 4d shows an array of MoS$_2$ FETs successfully fabricated using this process. It includes functioning MoS$_2$ FETs located at two different vertical levels, the conductance of which can be simultaneously modulated with a global back gate. The $I_{SD}$-$V_{SD}$ curves measured from two adjacent FETs located next to each other, both laterally and vertically (see inset, FIG. 4d), are shown in FIG. 4e. Both devices show $V_{BG}$ dependent conductance change (notice the smaller change for the 2$^{nd}$ layer) with an on-state $\sigma_\square$ of 2.5 µS (1$^{st}$ layer) and 1.5 µS (2$^{nd}$ layer), respectively. Furthermore, similar $\mu_{FE}$ values (11.5 cm$^2$/Vs and 8.8 cm$^2$/Vs) from the two devices (FIG. 19) were measured. The two ML MoS$_2$ films were grown on SiO$_2$ substrates prepared differently and that the 1$^{st}$ layer device has gone through additional steps, including the second MoS$_2$ growth. The data in FIG. 4 thus confirm the compatibility of the instant MOCVD-grown MoS$_2$ films with conventional thin film deposition and multi-stacking, which could be used to develop a three-dimensional device architecture based on TMD.

Figure 20:
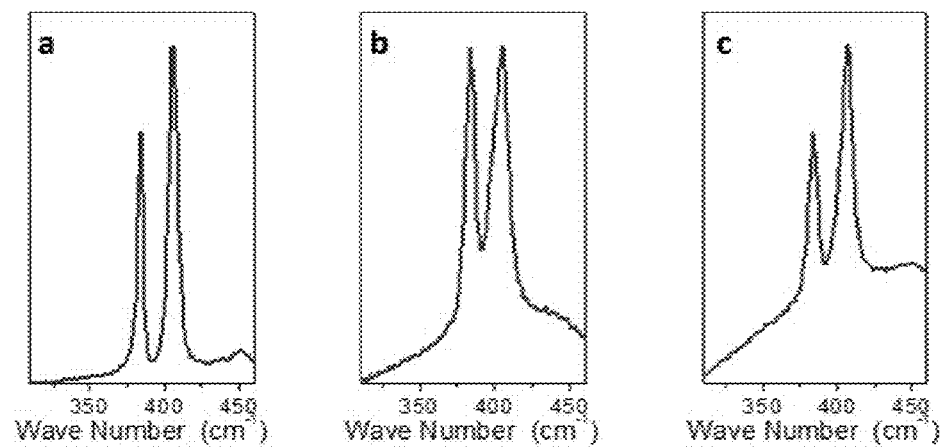
FIG. 20. a-c, Raman spectra for MoS$_2$ grown on Al$_2$O$_3$, SiN and HfO$_2$ covered Si, respectively. d-e, $\sigma_\square$-V$_{BG}$ curves for ML MoS$_2$ FET on Al$_2$O$_3$/Si and HfO$_2$/Si, respectively. The measured dielectric constant for Al$_2$O$_3$ and HfO$_2$ is 6.0 and 15.5, respectively. These MoS$_2$ films were grown under the same conditions developed for SiO$_2$ substrates as described in Methods, without any further optimization.
Figure 20:
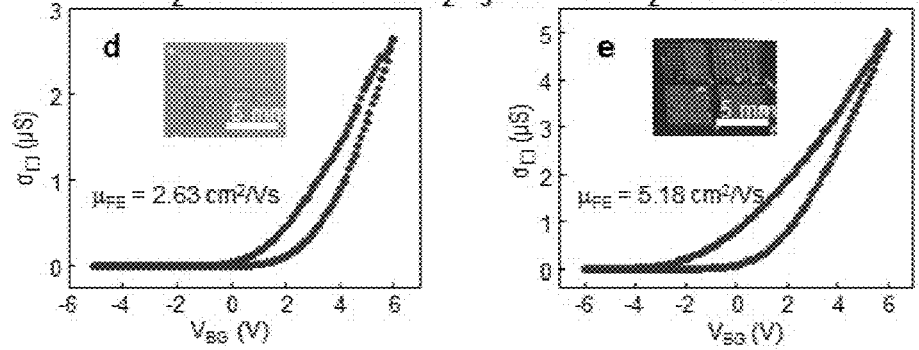

The high-mobility ML TMD films can be immediately utilized for the batch fabrication of TMD-based integrated circuitry consisting of FETs, photodetectors and light emitting diodes, on a technologically-relevant multi-inch wafer scale. In addition, as the MOCVD growth is controlled by the kinetics of precursor supply rather than specific precursor/substrate chemistry (an example of the latter would be the different graphene growth modes on Cu vs Ni), its use is not limited to the TMD/substrate combinations reported here. Instead, it could be generalized for producing various TMD materials, both semiconductor (e.g. MoSe$_2$, WTe$_2$)

and metal (e.g. NbSe$_2$, TaS$_2$), with precise layer control over a large scale. Indeed, the data show that, as an initial demonstration, the ML TMD growth is possible on a variety of other technologically important substrates (Al$_2$O$_3$, SiN, HfO$_2$) with the same growth conditions developed for SiO$_2$ (see FIG. 20 for MoS$_2$ growth and device fabrication on these substrates using these unoptimized conditions). Therefore, the versatile MOCVD growth provides an exciting new avenue for the growth, patterning and integration of multiple, high-quality ML TMD films with different compositions and electrical properties on a single substrate, enabling the future development of atomically thin integrated circuitry.

MOCVD growth of ML MoS$_2$ and WS$_2$ films. As illustrated in FIG. 2a, the synthesis of ML MoS$_2$ and WS$_2$ was carried out in a 4.3-inch (inner diameter) hot-wall quartz tube furnace. Molybdenum hexacarbonyl (MHC), tungsten hexacarbonyl (THC), diethyl sulphide (DES), which have high equilibrium vapour pressure near room temperature, are selected as chemical precursors for Mo, W, S, respectively, and introduced to the furnace in gas phase. H$_2$ and Ar are injected to the chamber using separate lines. All the precursors used in our MOCVD growth are commercially available with well-documented safety protocols (MHC: Sigma Aldrich 577766, THC: Sigma Aldrich 472956, DES: Sigma Aldrich 107247). The safety ratings for these precursors require them to be handled inside of a fume hood. (MHC, THC: NFPA rating for health hazard 4, DES: NFPA rating for health hazard 2). The optimum growth parameters for ML MoS$_2$ and WS$_2$ films are as follows. We use a total pressure of 7.5 Torr, growth temperature of 550° C. and growth time (to) of 26 hrs. The flow rate of precursors are 0.01 sccm for MHC or THC, 0.4 sccm for DES, 5 sccm for H$_2$, and 150 sccm for Ar, which were regulated by individual mass flow controllers (MFCs). The low flow rates were used for MHC, THC and DES for the layer-by-layer growth mode. The long growth time (t$_0$~26 hrs), is necessary for full ML growth, because of the low growth rate in this regime. NaCl is loaded in the upstream region of the furnace as a desiccant to dehydrate the growth chamber, which significantly increases the grain size, as discussed in FIG. 10. We use a 4-inch fused silica wafer or a 4-inch Si wafer with 285 nm thick thermal SiO$_2$ as the main growth substrates. Also the growth is possible on Al$_2$O$_3$, HfO$_2$, and SiN (see FIG. 20).

Optical measurements. Film patterning: Photolithography was performed to make the hole-array pattern on the MoS$_2$ film, where a sacrificial layer of PMMA A4 is coated before the photoresist. O$_2$ plasma (400 W, 300 s) was used to remove the unwanted MoS$_2$ and sacrificial PMMA from the SiO$_2$ surface. The chips were then placed in acetone for 3 hours to thoroughly remove the photoresist and the PMMA residue.

Optical Absorption:

The absorption measurements were performed with a Shimadzu UV-Vis-NIR Spectrometer under ambient conditions. All measured samples were grown on a fused silica substrate, and a bare fused silica substrate was used as the reference.

Photoluminescence:

The photoluminescence (PL) measurements were performed with a 532 nm excitation laser under ambient conditions. The PL spectra from the sample were collected by an imaging spectrometer with a CCD camera, and the PL images were taken directly using band pass filters with the centre wavelength corresponding to 1.9 eV for MoS$_2$ and 2.0 eV for WS$_2$.

TEM analysis. Sample preparation: The ML MoS$_2$ film grown on a SiO$_2$/Si substrate was coated by PMMA A2 or A4, and then the substrate was etched in KOH 1M solution at 90° C. After being rinsed in deionized water three times, the PMMA supported MoS$_2$ film was transferred to a TEM grid, and the chip was annealed in an ultra-high vacuum (10$^7$ Torr) or atmospheric pressure with Ar (100 sccm) and H$_2$ (100 sccm) flow at 350° C. for 3 hours in order to remove the PMMA.

DF-TEM:

DF-TEM images, along with electron diffraction patterns, were taken using an FEI Tecnai T12 Spirit, operated at 80 keV. The acquisition time for each dark field image was 10 seconds.

ADF-STEM:

ADF-STEM images were taken using a Nion Ultra STEM 100 operated at 60 keV. The convergence angle was 30 mrad, and the probe current was about 50 pA.

Figure 21:
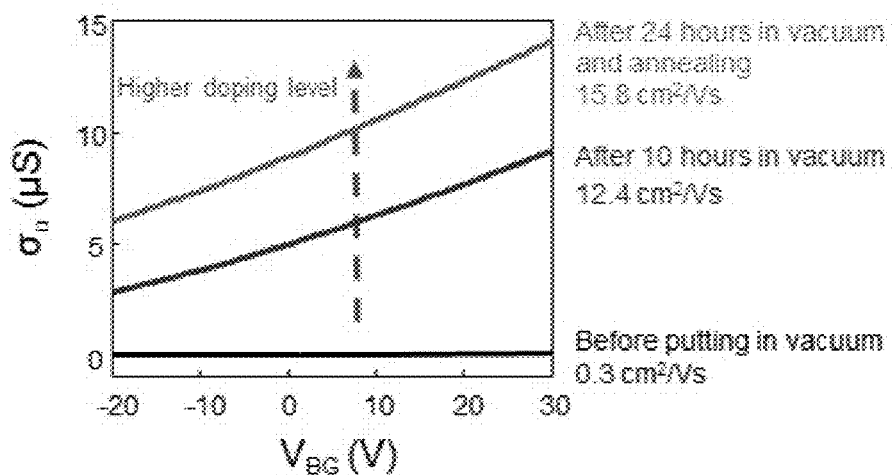
FIG. 21. a, The effect of measuring in vacuum and annealing on the device's electrical performance (the vacuum and annealing n-dope the MoS$_2$ devices). b, The transfer property of same device in ambient before and after HfO$_2$ encapsulation (encapsulation n-dopes MoS$_2$).
Figure 21:
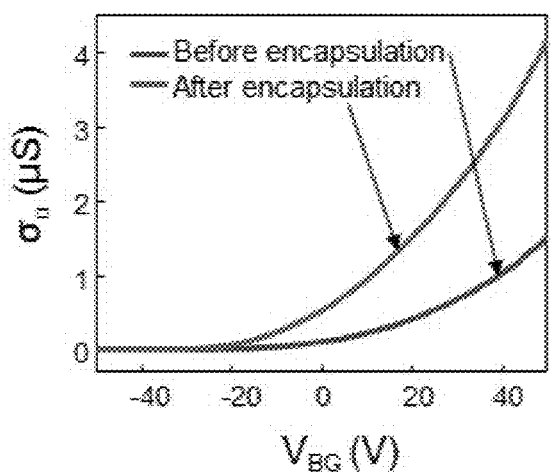

Device fabrication. For the FET fabrication, the process was started with an as-grown ML TMD film on 285 nm SiO$_2$/Si and first define the source and drain electrodes using the standard photolithography process, followed by e-beam evaporation of 0.5 nm Ti/75 nm Au. After lifting off using Microposit Remover 1165, the conducting channel for FET devices were defined and etched using photolithography and O$_2$ plasma etching. For top gate fabrication, 30 nm HfO$_2$ is deposited using atomic layer deposition (ALD) as the dielectric material, followed by the same electrode fabrication process for top-gate electrode fabrication (for top gate WS$_2$ FETs, we deposit 1 nm Al$_2$O$_3$ as the seeding layer for HfO$_2$ ALD). 30 nm HfO$_2$ was deposited on top of the back gated devices. This increases the carrier doping level and the conductance of our devices, enabling reproducible measurements under ambient conditions (see FIG. 21). All devices shown in FIGS. 3 and 4 were fabricated using standard photolithography techniques, except for the additional voltage probes (the five thin electrodes in FIG. 3a, inset) which were added later using e-beam lithography. The dimensions (W, width and L, length) of conducting channels are as follows: W 15 µm (FIG. 3a-3c), W 9 µm, L 19 µm (FIGS. 3d and 3g), W 7.7 µm, L 3.3 µm (FIG. 3e), W 7.7 µm, L 5.3 µm (FIG. 3f), W 15 µm, L 15 µm (FIG. 4d and 4e). For the fabrication of the multi-stacked device in FIG. 4, the SiO$_2$ consists of three successive depositions: 100 nm SiO$_2$ was deposited using PECVD at 30 W and 200° C., followed by 350 nm SiO$_2$ deposited using PECVD at 140 W and 350° C., and 50 nm SiO$_2$ deposited using ALD at 200° C.

Electrical measurements. All the electrical measurements (except for FIG. 3c) were done under ambient conditions using a custom-built probe station with an Agilent B1500 Device Analyzer. Both four-probe and two-probe measurements were used to accurately measure the sheet conductance. Comparing the results of four-probe and two-probe measurements, the contact resistivity is estimated to be approximately 50 Ω·mm. For temperature dependent measurements (FIG. 3c), FET devices were wirebonded and measured in a cryostat in vacuum for temperatures down to 77K.

Figure 7:
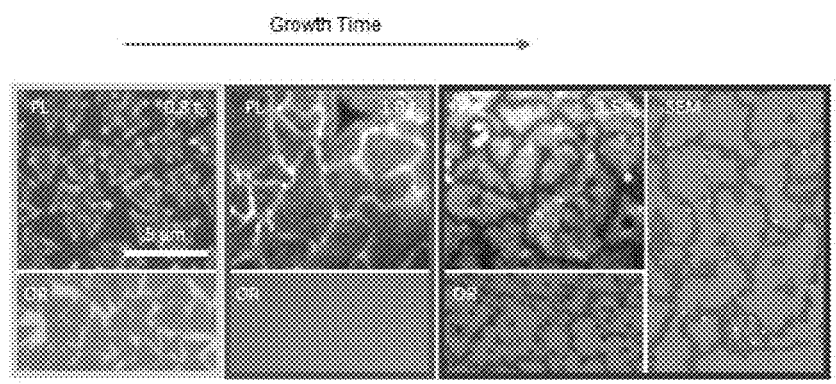
FIG. 7. Optical reflection, PL, SEM images of MOCVD-grown MoS$_2$ at different growth times, where to is the optimal growth time for full ML coverage.

A. Growth mechanism of layer-by-layer (LBL) growth. Two experiments were conducted to support LBL growth mechanism. First, FIG. 7 presents optical reflection (OR), PL and SEM images taken from our MOCVD grown ML MoS$_2$ films (average grain size~3 µm) after different growth times (0.8 t$_0$, 1.0 t$_0$, and 1.5 t$_0$). It confirms that additional nucleation on the existing first layer does not occur until the first layer growth is completed and the growth proceeds by enlarging the already-nucleated grains for t<t$_0$, most likely by edge attachment growth. After $t_0$ (full first layer growth), the nucleation for the second layer occurs at the grain boundaries (GBs) and in the basal plane. The PL intensity images show striking behaviours especially at the GBs. They show much brighter PL uniformly along GBs at $t=t_0$ and much darker PL there when $t>t_0$. The brighter PL at $t=t_0$ is consistent with the PL behaviours previously seen from the tilt GBs in CVD grown $MoS_2$. This suggests that upon the completion of the first layer growth ($t=t_0$), neighbouring grains are uniformly connected laterally by tilt GBs before further growth occurs for the second layer. Once the second layer starts growing on top of the first layer, the PL signal decreases especially along GBs, as the band structure of $MoS_2$ shifts from direct bandgap (ML) to indirect bandgap (for multilayers). Altogether, our data in FIG. 7 confirm the LBL growth mode in the MOCVD growth and the high-quality uniform intergrain connection at the optimum growth time ($t_0$). We also note that monitoring PL enhancement along GBs can be used in the future to find the optimum growth time $t_0$ and to confirm the high quality intergrain connection in the grown film.

Figure 8:
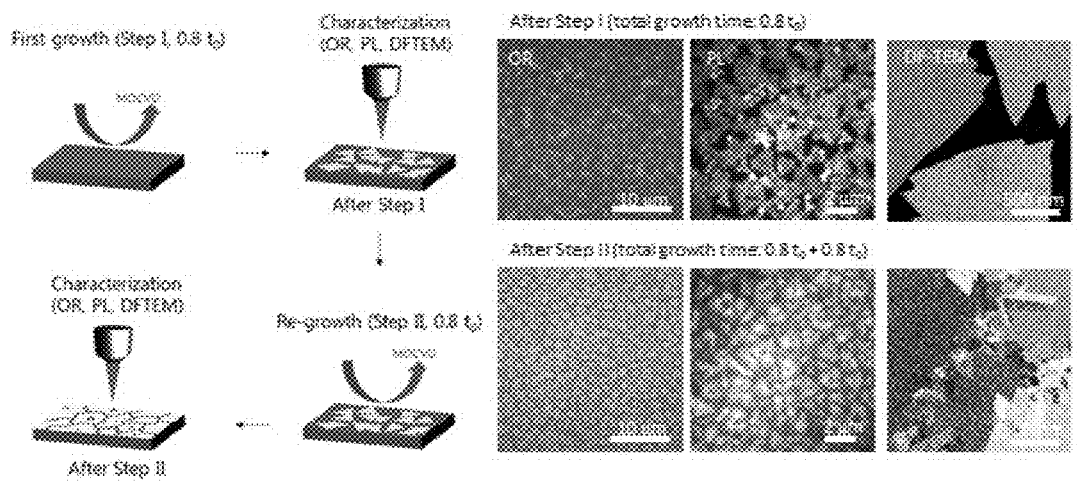
FIG. 8. Schematics of growth (step I) and re-growth (step II) of MoS$_2$ film and corresponding optical reflection, PL, DF-TEM images.

The edge attachment growth mechanism for our MOCVD growth is further supported by FIG. 8. Here, we performed a partial growth of ML $MoS_2$ (step I; $t<t_0$) and re-growth (step II), where the step II was conducted on the same sample generated after step I. The same film was characterized by optical reflection, PL, DF-TEM after each growth step to observe the location and morphologies of the growth. The data confirm that during the re-growth, $MoS_2$ grains continue to grow by edge attachment without generating additional nucleation sites on available $SiO_2$ surfaces. This is confirmed by the same average number of nuclei (or grains in the first layer) per unit area after step I and step II ($0.27\ \mu m^{-2} \rightarrow 0.26\ \mu m^{-2}$), again indicating that the empty space after step I was completely filled by continued growth of existing grains (along their edges) with the same crystal orientation without creating additional grains.

B. Thermal decomposition of precursors. We studied thermal reaction for DES and MHC using a residual gas analyser (RGA), which connected to the outlet of the furnace and detects the mass signal of the gas residue. FIG. 9 shows the relative intensity ratio for corresponding molecules extracted from mass spectra of RGA. First, we flowed vaporized MHC into the chamber at room temperature (Room T), and we confirmed that vaporized MHC contains several carbonyl molybdenum, $Mo(CO)_x$. Above 250° C. the signal for $Mo(CO)_x$ disappeared, indicating that $Mo(CO)_x$ was completely decomposed. In the case of DES, the intensity profiles at room temperature are almost the same as at growth temperature, 550° C. (Growth T), with both showing various hydrocarbon sulphides ($C_xH_yS$) under RGA resolution. This means that the concentration of DES in the furnace barely changed due to its decomposition. According to the RGA study, we summarize the status of precursors at growth temperature: i) the concentration of $C_xH_yS$ is uniform inside the furnace at the laminar flow condition. ii) MHC is decomposed to Mo and delivered by high flow Ar.

C. Dependence of grain size on concentration of $H_2$, $H_2O$, and DES. We have already shown the $H_2$ concentration dependence of grain size in FIG. 2d. The dependence on $H_2O$ concentration was observed under the presence of salt desiccant (NaCl, KCl, NaBr), as shown in FIG. 10a, where the grain size increased up to 100-fold, according to the presence/absence of salt. Also, FIG. 10b shows that the concentration of DES affects the grain size.

In order to explain these phenomena, we need to discuss the precursor decomposition and nucleation kinetics. First, according to hydrolysis and hydrogenolysis, $H_2$ and $H_2O$ promote the decomposition of DES precursor, which enhances the concentration of sulphur vapour. Also, the concentration of sulphur vapour linearly depends on the concentration of DES, since DES contains certain ratio of sulphur vapour. Second, the concentration of sulphur affects the nucleation kinetics and grain size. The assumptions we make are: (i) our growth is Mo diffusion limited growth, since the Mo concentration is kept low for layer-by-layer growth. In comparison, the concentration of DES is much higher than that of Mo vapour. (ii) when a Mo atom produced by thermal decomposition of MHC, arrives at the surface, it diffuses until reacting with sulphur produced by decomposition of DES. (iii) energetically, Mo and S atoms prefer to be adsorbed at a $MoS_2$ edge. (iv) if the decomposition rate of DES is fast, Mo atoms lose their chance to find energetically favourable positions and nucleation occurs at a non-edge region. Based on these assumptions, we conclude that the nucleation density of $MoS_2$ increases on the surface when the decomposition kinetics of DES becomes faster. Therefore, when $H_2$, $H_2O$, and DES concentrations are high, nucleation density increases and grain size decreases.

Although the present disclosure has been described with respect to one or more particular embodiments and/or examples, it will be understood that other embodiments and/or examples of the present disclosure may be made without departing from the scope of the present disclosure.

The invention claimed is:

1. A method of making a metal-chalcogenide film on a substrate, the film comprising 1 to 10 monolayers of the metal-chalcogenide comprising:
   contacting a metal precursor, a chalcogenide precursor, a reducing gas, and a substrate in a reactor such that the metal-chalcogenide film is formed,
   wherein the metal precursor and the metal chalcogenide precursor are each present in a gas phase and the metal precursor is present at a pressure of $1 \times 10^{-2}$ Torr or less and the chalcogenide precursor is present at a pressure of $1 \times 10^{-1}$ Torr or less, wherein the contacting is carried out in the presence of a desiccant.

2. The method of claim 1, wherein the contacting is carried out at a water concentration of less than $1 \times 10^{-2}$ Torr.

3. The method of claim 1, wherein the metal precursor has a concentration lower than a concentration of the chalcogenide precursor.

4. The method of claim 1, wherein partial pressures of the metal precursor and the chalcogenide precursor are controlled such that grains of a first monolayer are connected laterally until the first monolayer is formed across about 80% or greater of the substrate covered by the film.

5. The method of claim 4, further comprising forming a second monolayer on the first monolayer after the first monolayer is formed on about 80% or greater of the substrate covered by the film.

6. The method of claim 5, wherein the second monolayer is formed on the first monolayer after the first monolayer is formed on about 95% or greater of the substrate covered by the film.

7. The method of claim 1, wherein the desiccant is a salt.

8. The method of claim 7, wherein the salt is NaCl, KCl, or NaBr.

9. A method of making a metal-chalcogenide film on a substrate, the film comprising 1 to 10 monolayers of the metal-chalcogenide comprising:

contacting a metal precursor, a chalcogenide precursor, a reducing gas, and a substrate in a reactor such that the metal-chalcogenide film is formed, wherein the metal precursor is present in a gas phase and the metal precursor is present at a pressure of $1 \times 10^{-2}$ Torr or less, wherein the contacting is carried out in the presence of a desiccant.

10. The method of claim 9, wherein the contacting is carried out at a water concentration of less than $1 \times 10^{-2}$ Torr.

11. The method of claim 9, wherein the metal precursor has a concentration lower than a concentration of the chalcogenide precursor.

12. The method of claim 9, wherein partial pressures of the metal precursor and the chalcogenide precursor are controlled such that grains of a first monolayer are connected laterally until the first monolayer is formed across about 80% or greater of the substrate covered by the film.

13. The method of claim 12, further comprising forming a second monolayer on the first monolayer after the first monolayer is formed on about 80% or greater of the substrate covered by the film.

14. The method of claim 13, wherein the second monolayer is formed on the first monolayer after the first monolayer is formed on about 95% or greater of the substrate covered by the film.

15. The method of claim 9, wherein the desiccant is a salt.

16. The method of claim 15, wherein the salt is NaCl, KCl, or NaBr.

* * * * *